United States Patent [19]

Toda

[11] Patent Number: 5,117,270
[45] Date of Patent: May 26, 1992

[54] PHOTOSENSOR WITH AU DIFFUSED $PB_2CRO_5$ OR SIMILAR FILM

[76] Inventor: Kohji Toda, 1-49-18, Futaba, Yokosuka, Japan

[21] Appl. No.: 595,460

[22] Filed: Oct. 10, 1990

[30] Foreign Application Priority Data

| Oct. 11, 1989 | [JP] | Japan | 1-265941 |
| Jun. 14, 1990 | [JP] | Japan | 2-156126 |
| Jun. 28, 1990 | [JP] | Japan | 2-170471 |

[51] Int. Cl.⁵ .................................................. H01L 27/14
[52] U.S. Cl. .................................................. 357/30; 357/4; 357/10; 357/63; 357/68; 357/32; 136/255
[58] Field of Search .................. 357/30 Q, 30 R, 30 J, 357/30 C, 30 P, 10, 68, 4, 30 B, 32, 63; 136/255

[56] References Cited

U.S. PATENT DOCUMENTS

| 3,717,799 | 2/1973 | Chapman | 357/30 B X |
| 3,958,554 | 5/1976 | Schmidt | 357/10 X |
| 4,490,014 | 12/1984 | Levinson | 357/10 X |
| 4,781,767 | 11/1988 | Toda et al. | 357/30 B X |

Primary Examiner—William Mintel
Attorney, Agent, or Firm—Cushman, Darby & Cushman

[57] ABSTRACT

A photosensor element is made of $PbO \cdot Cr_2O_3$ compound thin film, $Pb_2CrO_5$ thin film into which Au, Ag, Cu, Pb, Cr or S is diffused, or $Pb_5CrO_8$. A photo sensing device includes one photo sensing element selected from among the foregoing elements and a pair of electrodes attached thereto. The electrodes may be a plurality of interdigital electrodes. The paired electrodes may be formed on the photosensor element. The photosensor element may be sandwiched by the electrodes.

28 Claims, 28 Drawing Sheets

| ELEMENT | | PHOTO CURRENT (pA) 543.5nm, 10mW/cm² 40V | DARK CURRENT (pA) 40V | PHOTO CURRENT /DARK CURRENT | γ | V-I CHARACTER-ISTIC | THICKNESS (μm) |
|---|---|---|---|---|---|---|---|
| A | before | 8.5 | 0.02 | 425 | 0.50 | super Linear | 0.16 |
| | after | 200 | 0.7 | 286 | 0.70 | Linear | |
| B | before | 11.5 | 0.44 | 26 | 0.50 | super Linear | 0.19 |
| | after | 126 | 2.5 | 50 | 0.70 | Linear | |
| C | before | 1.2 | 0.003 | 400 | 0.51 | super Linear | 0.20 |
| | after | 180 | 0.15 | 1200 | 0.74 | Linear | |

Au FILM THICKNESS : 400–1000Å

DIFFUSION PROCESS : 400–420°C, 6Hr before : Without Au after : Au diffused film

FIG. 23

PHOTOSENSOR WITH AU DIFFUSED PB$_2$CRO$_5$ OR SIMILAR FILM

BACKGROUND OF THE INVENTION

The present invention relates to a photosensor and more particularly to a photosensor having a fast time response, good sensitivity and high resolution.

A great number of photosensors employing various kinds of photo detecting materials (photosensor elements) have been developed. A line image sensor is one type of photosensor for detecting a one dimensional image and is typically used in facsimile machines. A read-out device for reading out the image in a facsimile machine comprises a line image sensor made of MOS or CCD and a lens combination for projecting the image onto the line image sensor. This kind of read-out device makes the size of the facsimile machine large because of the required lens combination.

Therefore, in order to miniaturize the facsimile apparatus there has been proposed a contact-type line image sensor comprising a CdS-CdSe photo conductive element array or a thin film photosensor element array of, for example, amorphous silicon (Si) photo diodes. The CdS-CdSe photo conductive element array features provision of a large photo current and homogeneous element sensitivity. The use of this array with a matrix driving system simplifies the read-out circuit. Since the CdS-CdSe array has a relatively low photo responsibility, the use of the CdS-CdSe array makes it difficult to get a high transmission velocity with a read-out device in a facsimile machine. The amorphous Si photo diode array has a photo responsibility which is one hundred times as large as that of the CdS-CdSe array. The amorphous photo Si diode array, however, necessarily requires a read-out circuit with a direct driving system having a number of analog switches, resulting in a complex read-out circuit and making it difficult to integrate the respective photo detecting elements in high density and to improve the resolution characteristic.

SUMMARY OF THE INVENTION

An object of the present invention is to provide a photosensor having a fast time response.

Another object of the present invention is to provide a photosensor having a high resolution.

Another object of the present invention is to provide a photo sensing device having a simplified structure and a superior sensitivity.

Still another object of the present invention is to provide a photosensor capable of providing a large photo current as compared with conventional photosensors. Further still, another object of the present invention is to provide a photosensor having high color sensitivity for a wide color range including the red and the near ultraviolet light spectrums.

According to the present invention there is provided a photosensor element comprising a PbO·Cr$_2$O$_3$ compound thin film and a pair of electrodes attached thereto.

According to one embodiment of the present invention there is provided a photosensor element comprising a Pb$_2$CrO$_5$ thin film and a pair of electrodes attached thereto.

According to another embodiment of the present invention there is a provided a photosensor comprising a Pb$_2$CrO$_5$ thin film formed on a electrodes of metal thin film formed on the Pb$_2$CrO$_5$ thin film and having essentially an equal gap therebetween.

According to other embodiments of the present invention there is provided a photo sensing device comprising a first metal thin film, a second metal thin film, and a Pb$_2$CrO$_5$ thin film disposed between the first and second metal thin films.

According to a further embodiment of the present invention there is provided a photo sensing device comprising a plurality of photo detection (photosensor) elements each comprised of a first electrode, a second electrode and a Pb$_2$CRO$_5$ thin film disposed between the first and second electrodes. The plurality of photo detection elements can be arranged in line or in matrix form. Either Pb$_2$CrO$_5$ thin film into which Au, Ag, Cu, Pb, Cr or S is diffused or Pb$_5$CrO$_8$ thin film may be employed.

Other objects and features of the present invention will be clarified from the following description with reference to the attached drawings.

BRIEF DESCRIPTION OF THE DRAWINGS

FIG. 23 gives photosensor parameters for an Au-diffused $Pb_2CrO_5$ thin film and a $Pb_2CrO_5$ thin film;

PREFERRED EMBODIMENTS OF THE INVENTION

The invention uses, as the photo detecting means, a semi-insulating $Pb_2CrO_5$ thin film on which interdigital electrodes are formed. The interdigital electrodes are formed from a plurality of paired comb-like electrodes which are opposed with a minute space (gap). The present invention has n pairs of interdigital electrodes which are disposed in a column direction with an equal interval therebetween. The photo detecting element is comprised of a $Pb_2CrO_5$ thin film formed on a glass substrate and a pair of the interdigital electrodes. The image sensor of the invention is comprised of a photo sensor element array of n photo detecting elements equally spaced along a column direction.

The inventor has determined the photovoltaic force effect and the photo conductivity effect of $Pb_2CrO_5$ in visible and near ultraviolet wavelength regions and has studied the application of these characteristics to the photoelectrical effect element. A Shottky-barrier is created, by forming a pair of thin film electrodes on the $Pb_2CrO_5$, between the electrode edge and $Pb_2CrO_5$. It has been experimentally confirmed that the photo detecting element is realizable using the photovoltaic effect at the Shottky-barrier region. The interdigital electrodes are employed to lengthen the Shottky-barrier region for increasing the density of the optical sensitivity region, for increasing the photo current from the light receiving portion and the integration density of the photosensor elements. $Pb_2CrO_5$ thin film has a larger resistance than amorphous Si thin film and therefore it is easy to separate the elements, thereby realizing the read-out circuit based on the matrix driving system.

Figure 1:
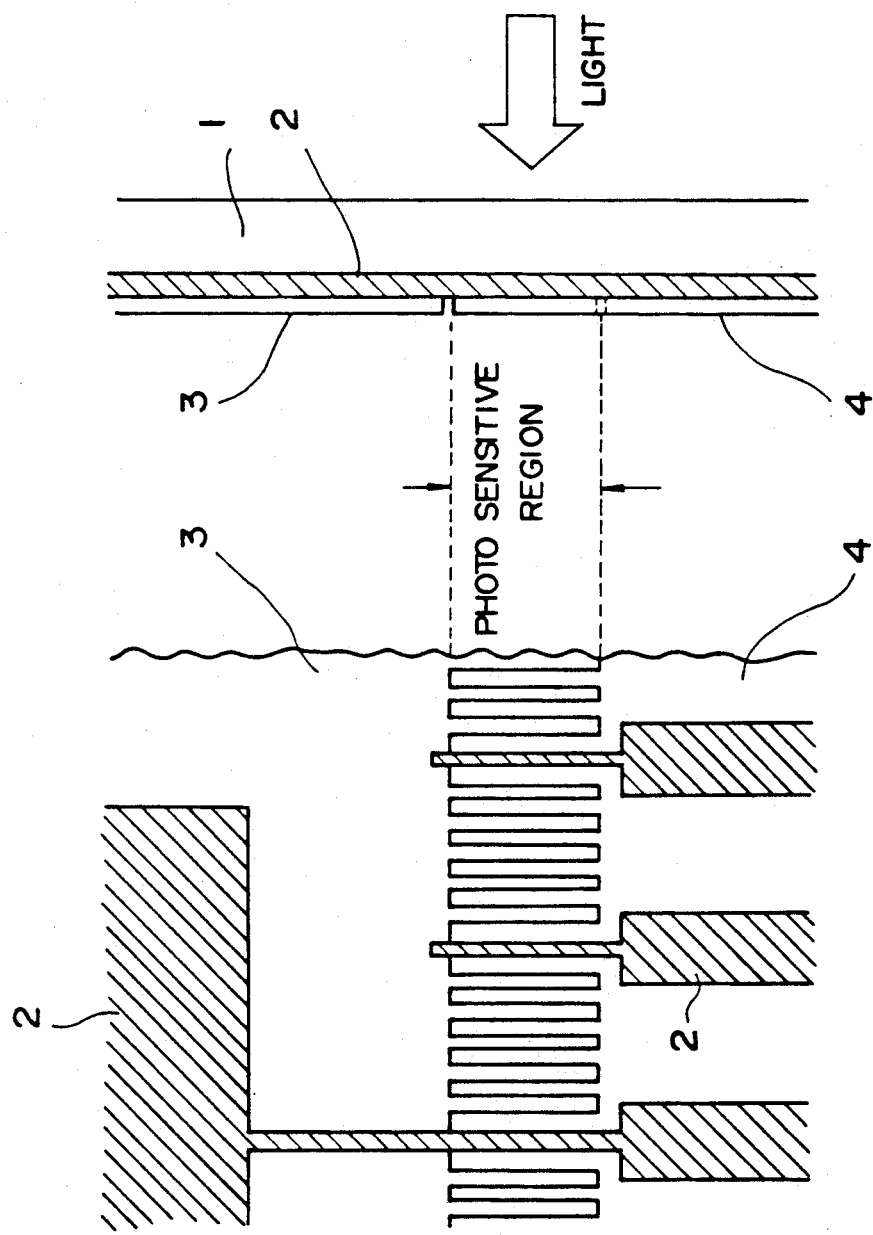
FIG. 1 shows plan and side views of the photosensor according to one embodiment of the present invention.

FIG. 1 shows a plan view and a sectional view of one embodiment of the present invention. This embodiment comprises a glass substrate 1, a $Pb_2CrO_5$ thin film 2, a common electrode 3 and a specified electrode 4.

The glass substrate 1 is a glass (No. 7059 made by Corning in the U.S.A.) which is 35 mm in width, 35 mm in length and 0.4 mm in thickness. $Pb_2CrO_5$ thin film 2 is formed to a thickness of 0.65 mm on the substrate 1 by electron-beam evaporation (EBE) based upon magnetic convergence.

The electrodes 3, 4 are generally an Au thin film of 420 Å in thickness. The Au thin film is deposited after the evaporation of the $Pb_2CrO_5$ thin film 2, under a vacuum below $1 \times 10^{-5}$ Torr and at room temperature. An electron-beam lithography technique is used to evaporate the Au thin film on the whole $Pb_2CrO_5$ thin film 2, and the Au thin film is patterned to define the shape of the electrodes 3, 4. The etching is executed by kalium iodine-saturated solution and the photo resist is finally removed by oxygen plasma.

Figure 2:
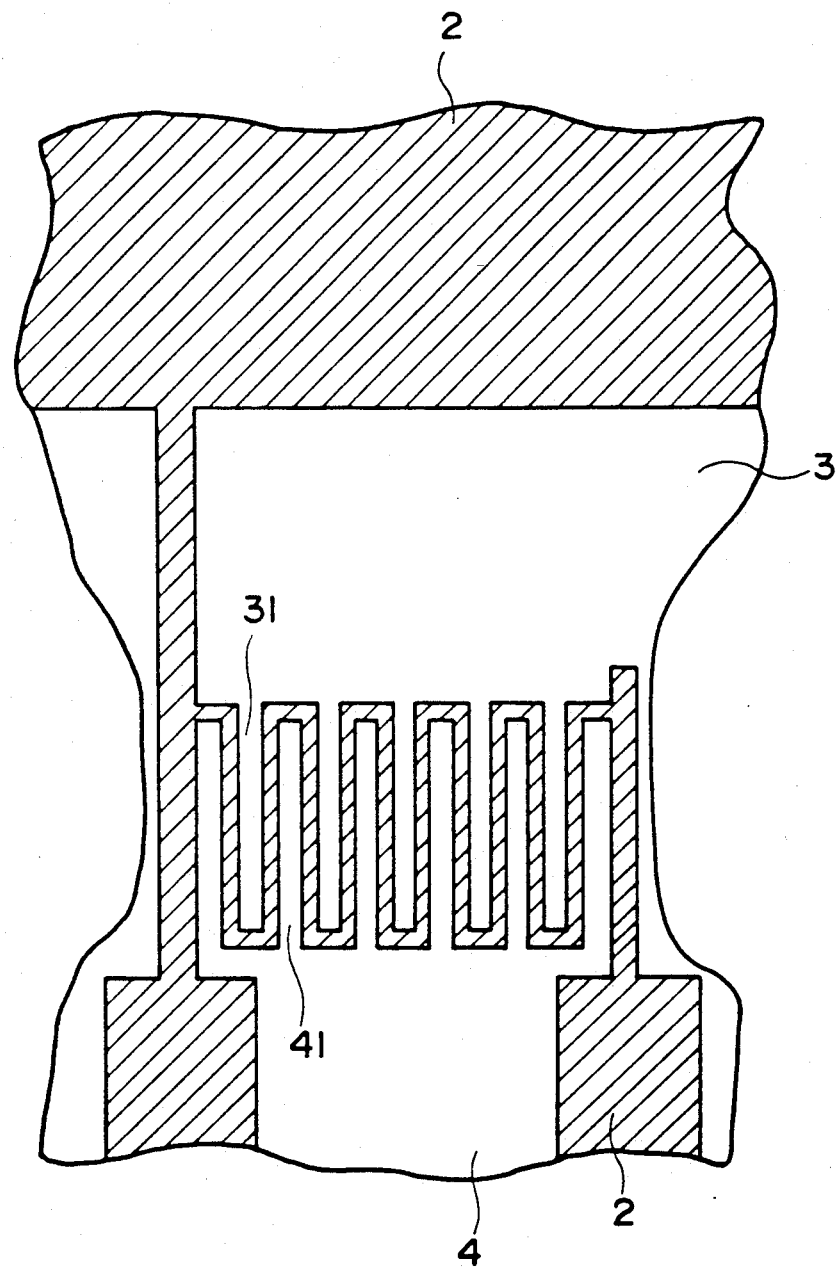
FIG. 2 shows an enlarged plan view of a part in FIG. 1.

FIG. 2 shows a plan view of one photo sensor element in FIG. 1. A pair of interdigital electrodes, the common electrode 3 and the specified electrode 4, and the $Pb_2CrO_5$ thin film 2 comprise one photosensor element. As is best seen in the drawing, the comb-like electrodes of the common electrode 3 and the specified electrode 4 are formed to have a minute gap which is, for example, a 2 μm gap. In the embodiment shown, five finger-like electrodes 31 are formed at the side of the common electrode 3 and six finger-like electrodes 41 are formed at the side of the specified electrode 4. In FIGS. 1 and 2, the hatched portion represents the semi-insulating $Pb_2CrO_5$ thin film 2.

Figure 3:
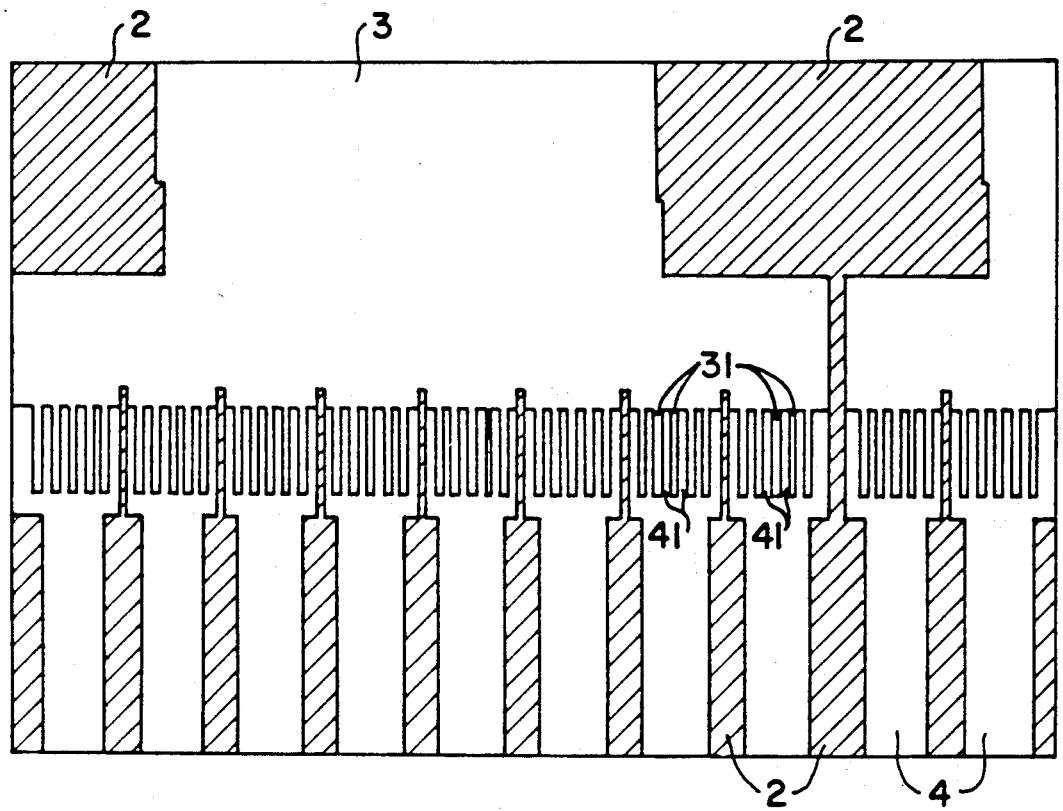
FIG. 3 shows a plan view of a portion of the invention including ten photosensor elements in accordance with the embodiment in FIG. 1.

In FIG. 1, 32 photosensor elements are arranged in one column direction. These elements are formed with a density of 8/mm, as shown in FIG. 3. The length and width of each element and 100 μm and 120 μm, respectively. The photo detecting element is comprised of a pair of interdigital electrodes and the $Pb_2CrO_5$ thin film 2. The photosensor elements are separated by a 5 μm gap and the interval of the elements is 125 μm. The 5 μm gap is sufficient for element separation because of the large resistance of $Pb_2CrO_5$ thin film 2.

In this embodiment, 32 pairs (n=32) of interdigital electrodes are formed, 8 comb-like electrodes at the side of the common electrode 3 are connected altogether in a group by the Au thin film, and the other comb-like electrodes are separated from each other by the 5 μm gap. The 32 pairs of the interdigital electrodes are separated into four electrode groups (m=4) each being electrically separated by a minute gap. In each electrode group eight pairs (p=8) of the interdigital electrodes are formed. Namely, one photosensor element group is comprised of eight photosensor elements having one common electrode. Four photosensor element groups are included in the embodiment.

Figure 4:
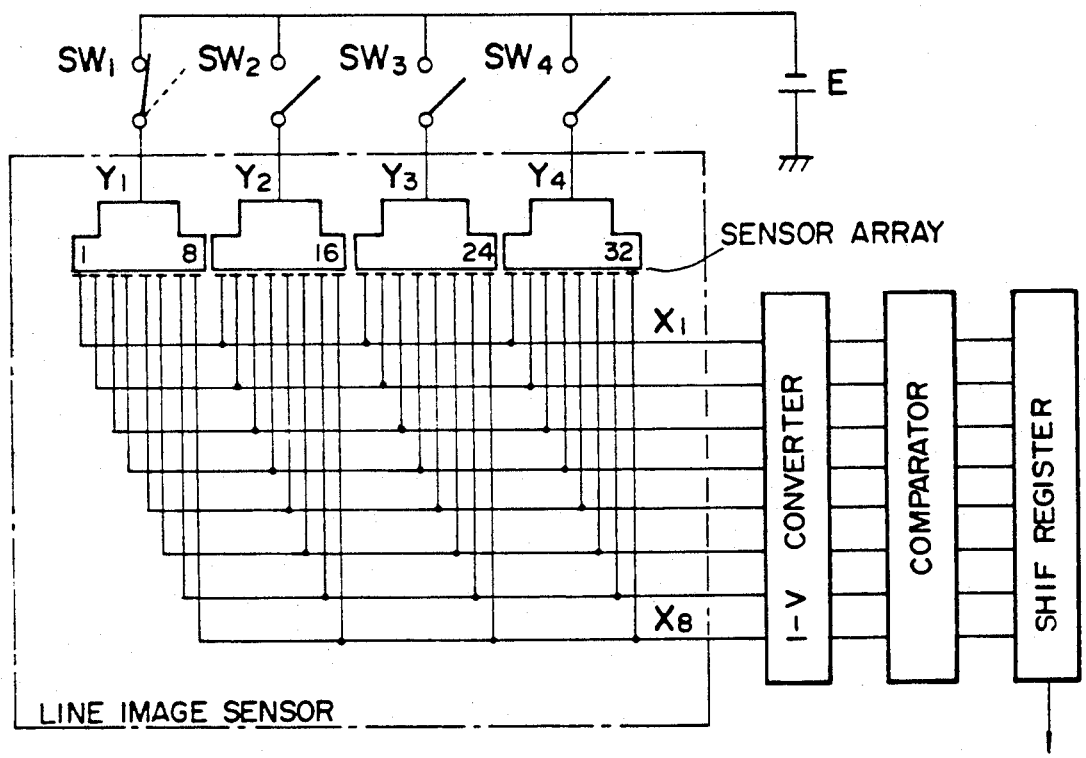
FIG. 4 shows a block diagram of a read-out circuit for reading out an image.

FIG. 4 is a read-out circuit for the embodiment shown in FIG. 1. The circuit employs the matrix driving system. In FIG. 4, $Y_1$, $Y_2$, each including eight elements. By the use of switches SW1-SW4 a negative DC voltage E is sequentially applied to the photosensor element groups $Y_1$-$Y_4$. An I-V converter comprises, for example, model TLC 274 CP made by Texas Instrument, which includes an operational amplifier with a low input bias current for converting the output current from each photo sensor element of the line image sensor into a voltage signal. The sensitivity of the I-V converter is 10 mV/nA. The comparator converts the output of the I-V converter into a digital signal of TTL level. A shift register converts the 8 bit parallel digital signal from the comparator into a serial (time-sequential) digital signal.

Figure 5:
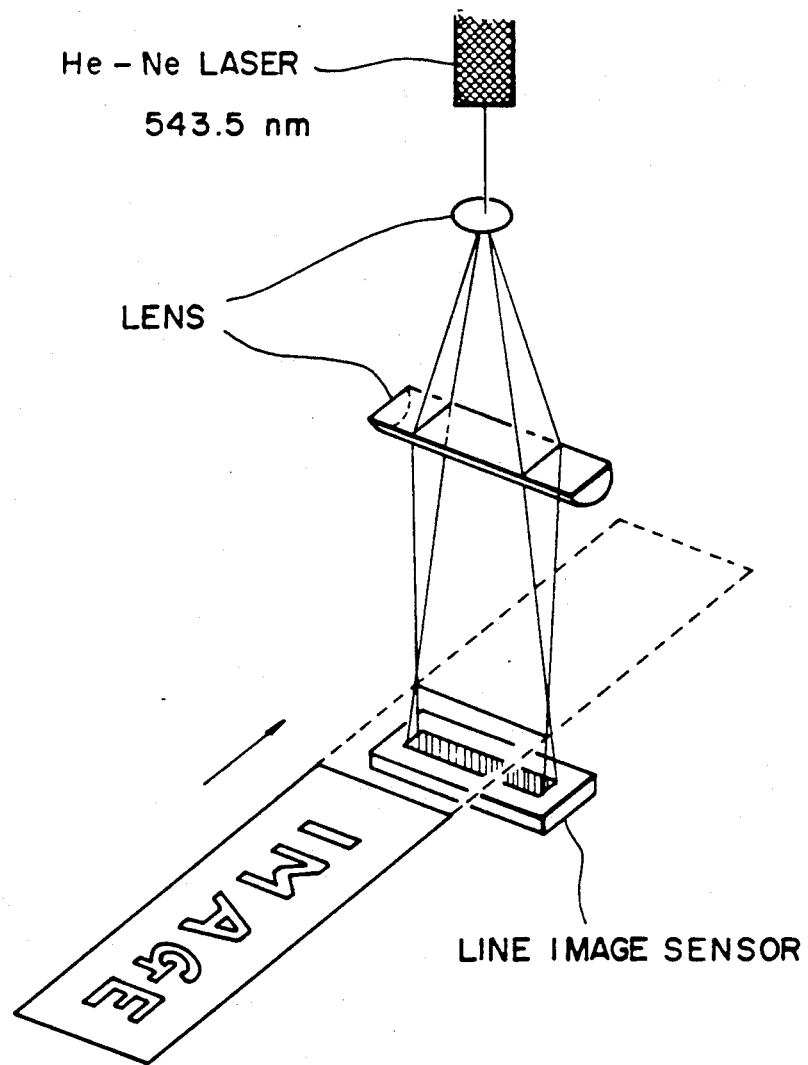
FIG. 5 shows a general configuration for a lens combination used in the embodiment of FIG. 1.

FIG. 5 represents a schematic drawing of the optical system used in the embodiment of FIG. 1. The laser output from the He—Ne laser has a wavelength of 543.5 nm and a power of 0.6 mW. The lens focuses the laser light onto a photographic negative film. The line image sensor is made to contact with the lower surface of the negative film.

Figure 6:
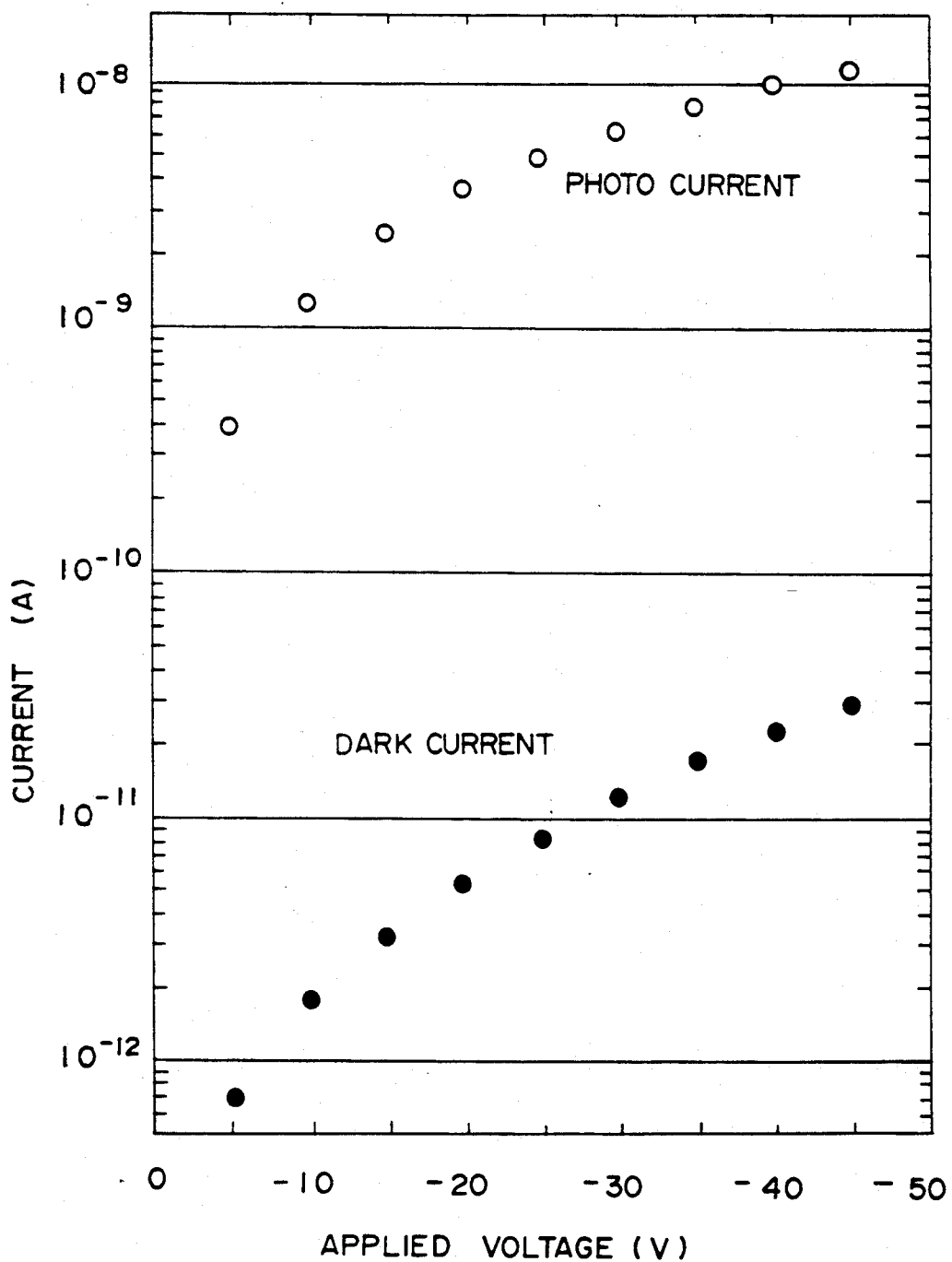
FIG. 6 shows characteristic curves of photo and dark currents plotted versus applied voltage.
Figure 7:
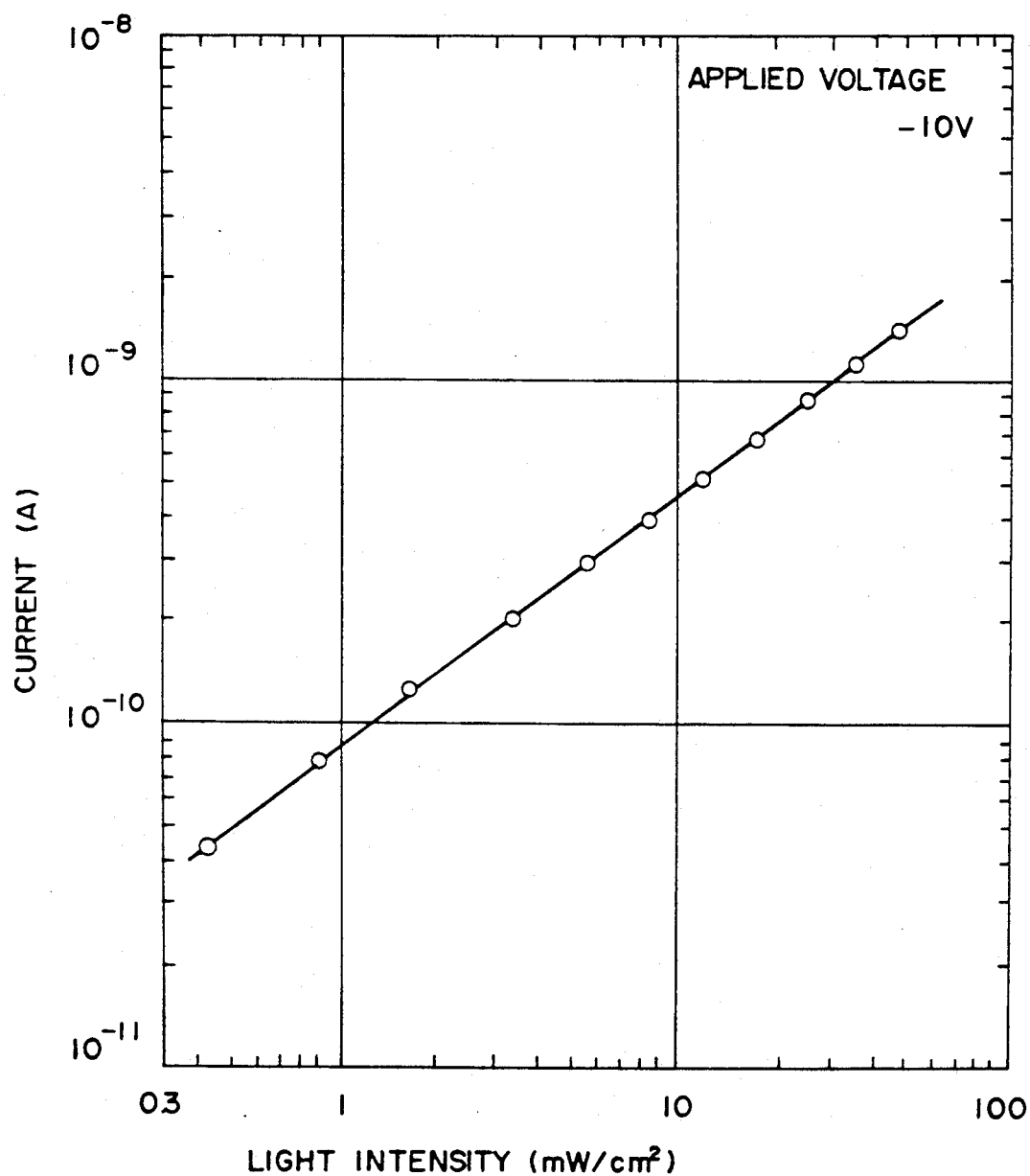
FIG. 7 shows photo current plotted versus light intensity.

FIG. 6 shows characteristic curves of photo current and dark current plotted against applied voltage for the type of photosensor element shown in FIG. 1 under the static state condition where the strength of the illuminated light is 46 mW/cm². Those skilled in the art will understand from this drawing that a sufficient photo current may be obtained by a voltage of 40 V. FIG. 7, which shows the relationship between light strength and photo current at an applied voltage of −10 V, confirms that the photo current has a linear relationship with light strength when plotted on a logarithmic scale.

Figure 8:
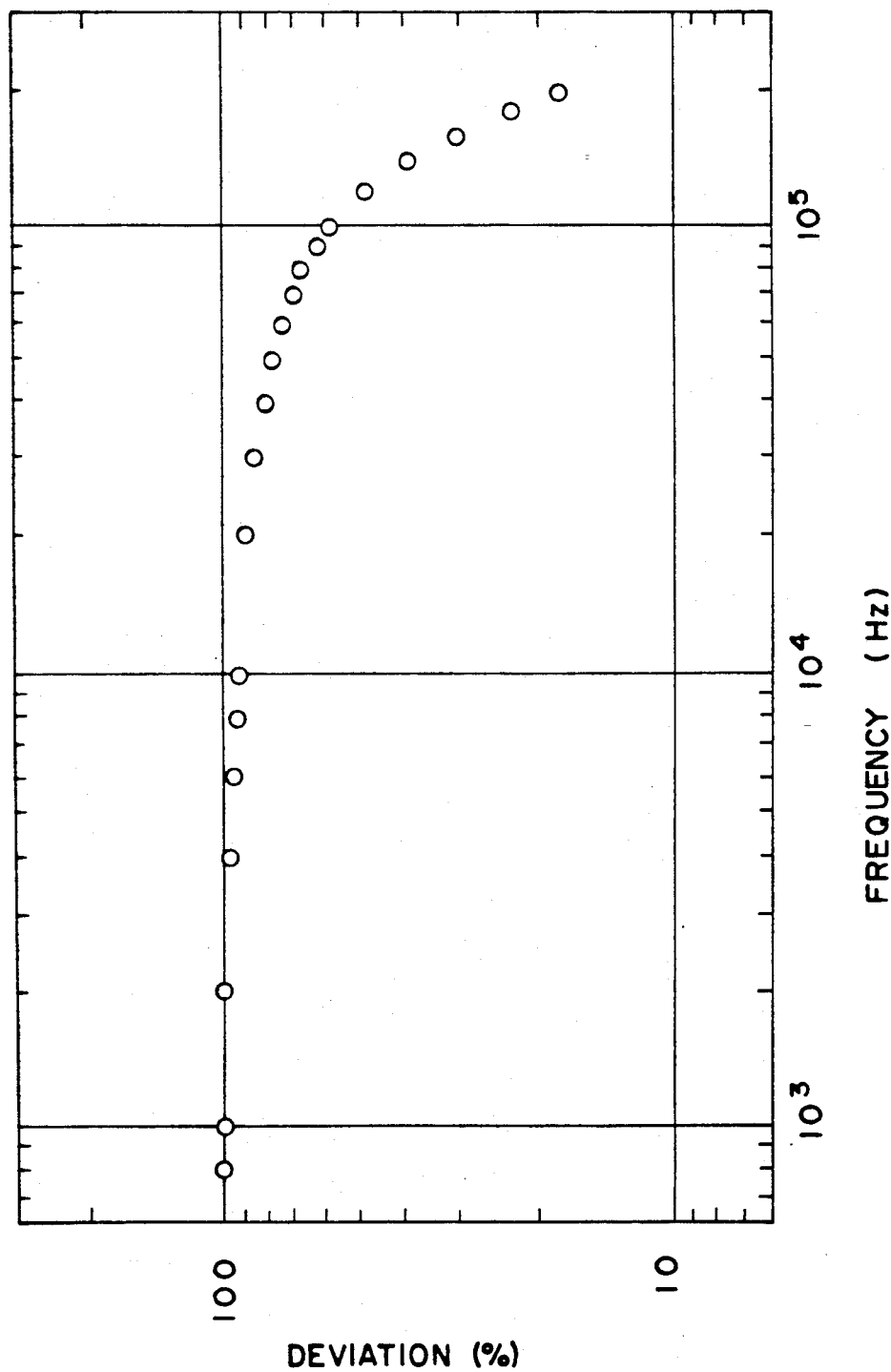
FIG. 8 shows the amount of current deviation plotted versus modulation frequency.

FIG. 8 is a characteristic curve of photo current variation plotted versus illuminated light modulation frequency, and is obtained from the photo sensing device shown in FIG. 1 where the frequency-modulated light is illuminated thereto with the light strength between 0 and 27 mW/cm² by using an acoustical modulator. FIG. 8 is normalized for a photo current having a 1 kHz modulation frequency. From FIG. 8, it can be seen that a current deviation of 50% is obtained at 120 KHz. This optical response velocity is almost the same as that of the amorphous Si photo diode array, that is, sufficient to read out a letter statement at a velocity of 1 msec/line. The matrix driving system of the $Pb_2CrO_5$ sensor requires no charge storage. On the other hand, the charge storage time is an important factor for the read-out velocity in the amorphous Si photo diode.

Figure 9:
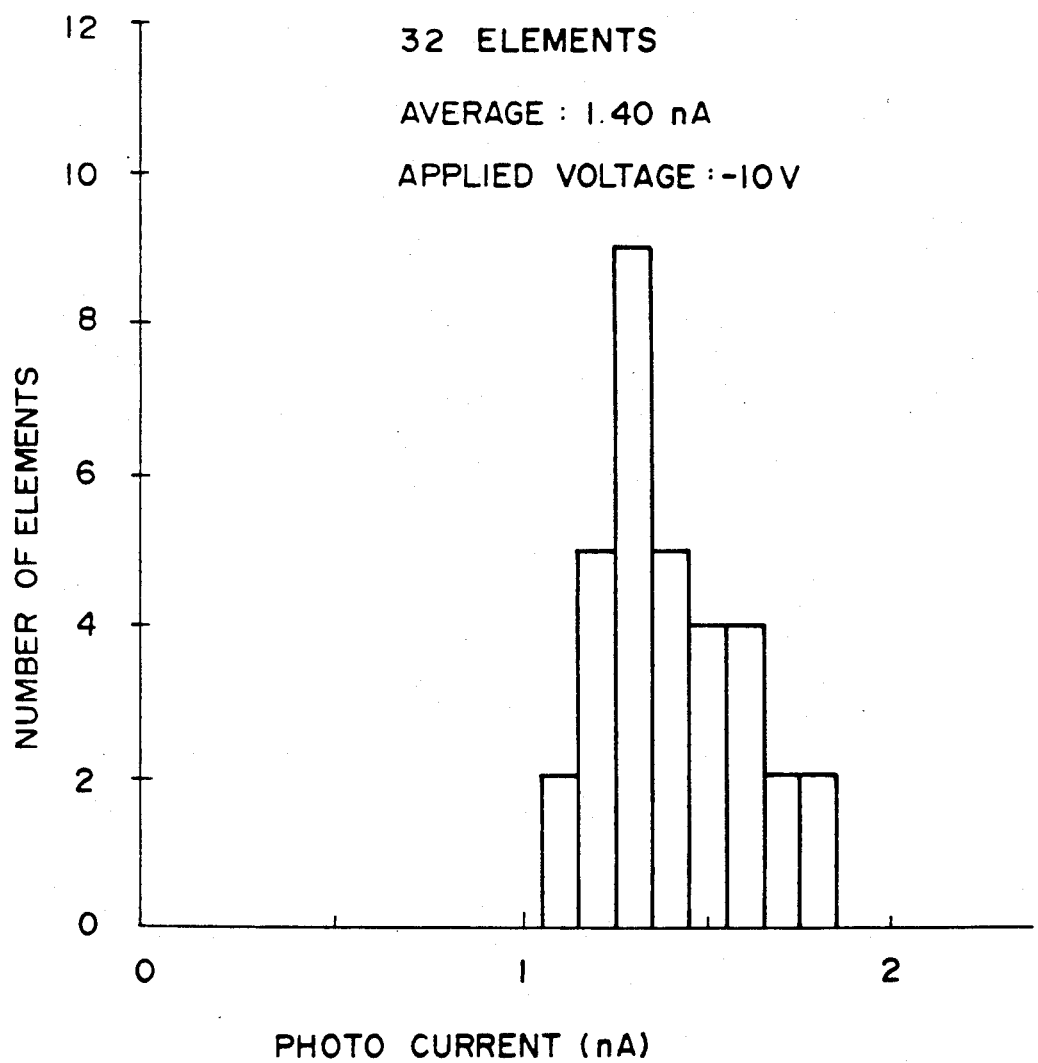
FIG. 9 shows the relationships between the number of elements and photo current, for average current 1.40 nA and applied voltage $-10$ V.
Figure 10:
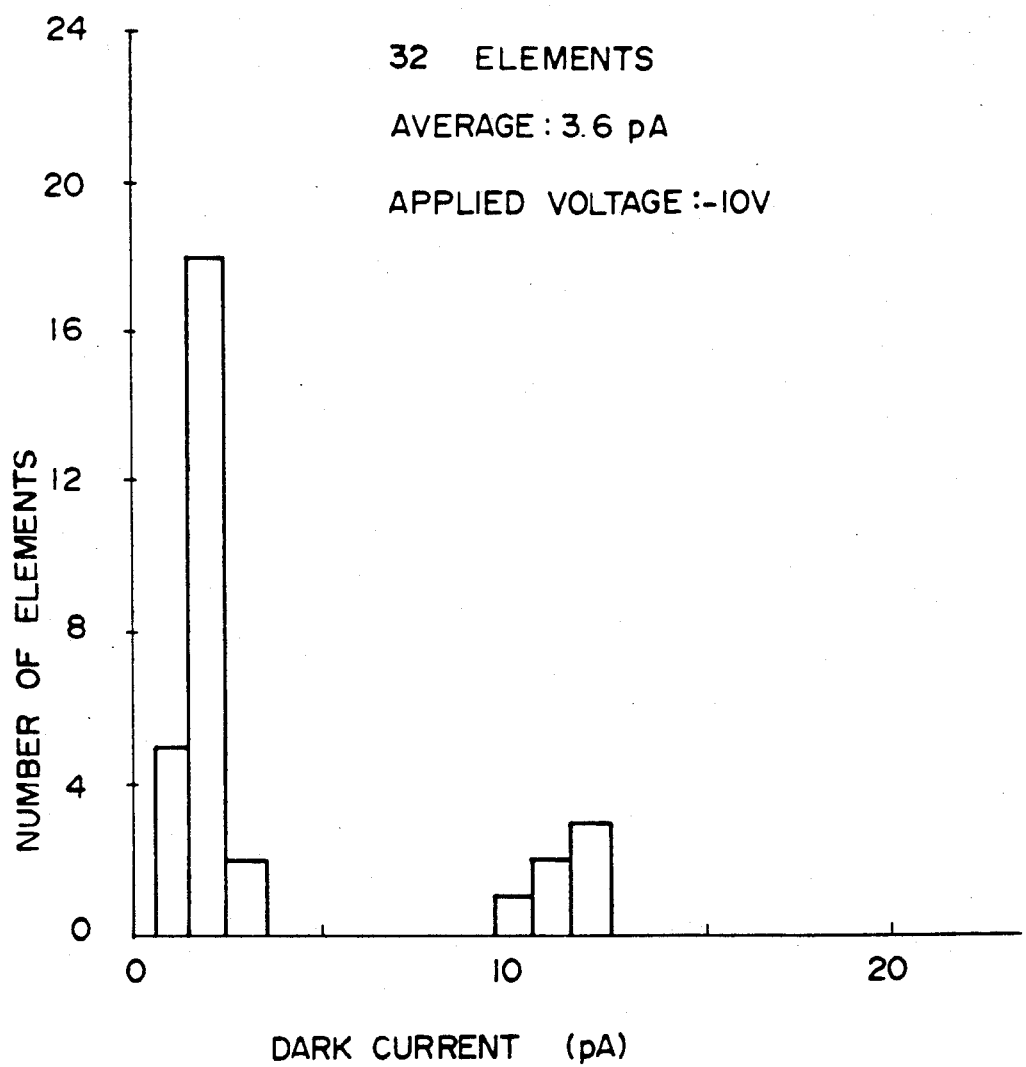
FIG. 10 shows the relationship between the number of elements and dark current, for average current 3.6 pA and applied voltage $-10$ V.

FIGS. 9 and 10 show the variation in photo current and dark current for the photo sensor element obtained under the statistical condition where the light strength is 46 mW/cm² and the applied voltage is −10 V.

Figure 11:
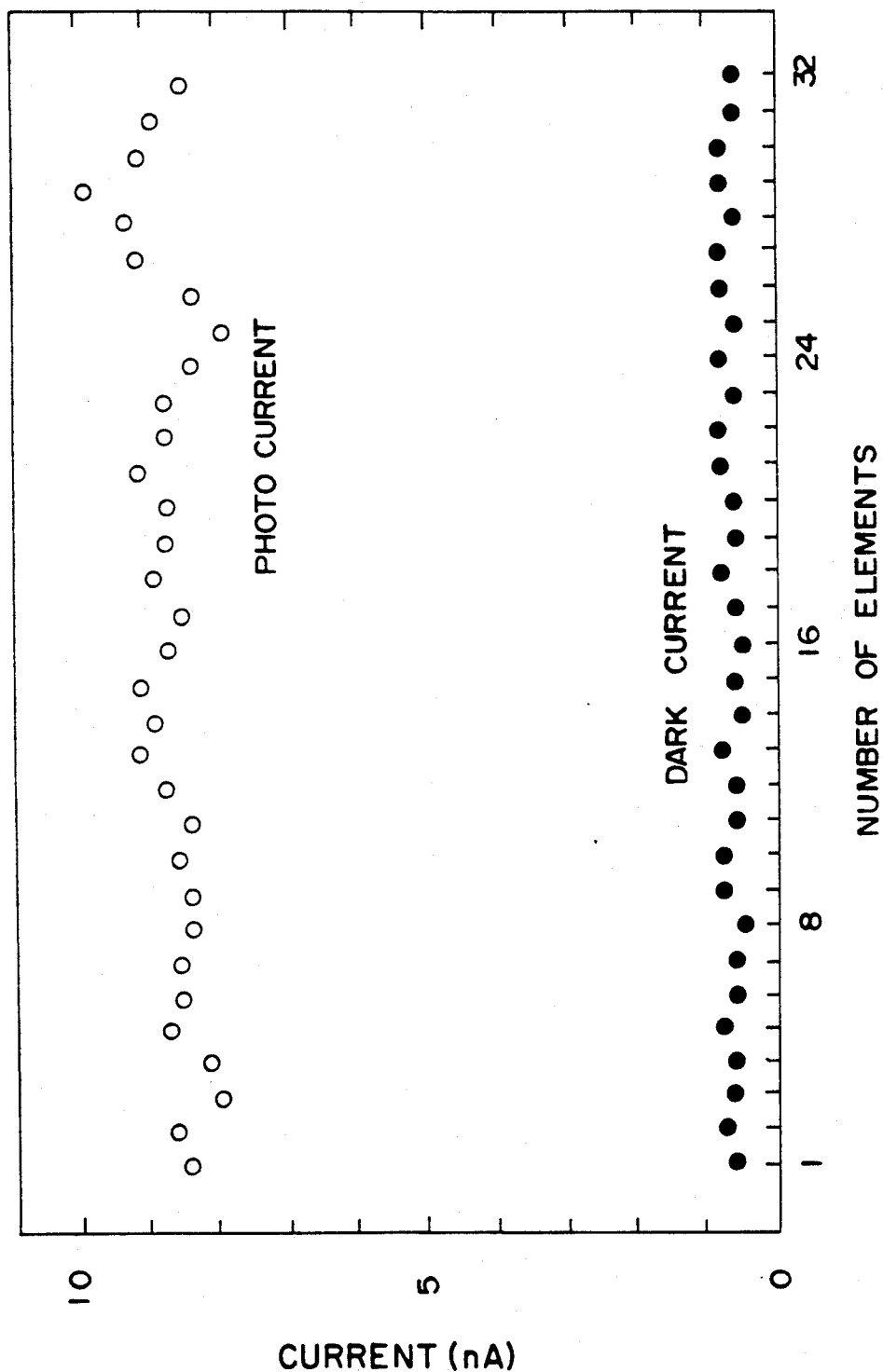
FIG. 11 shows variations in the photo current and the dark current plotted versus the number of elements.
Figure 12:
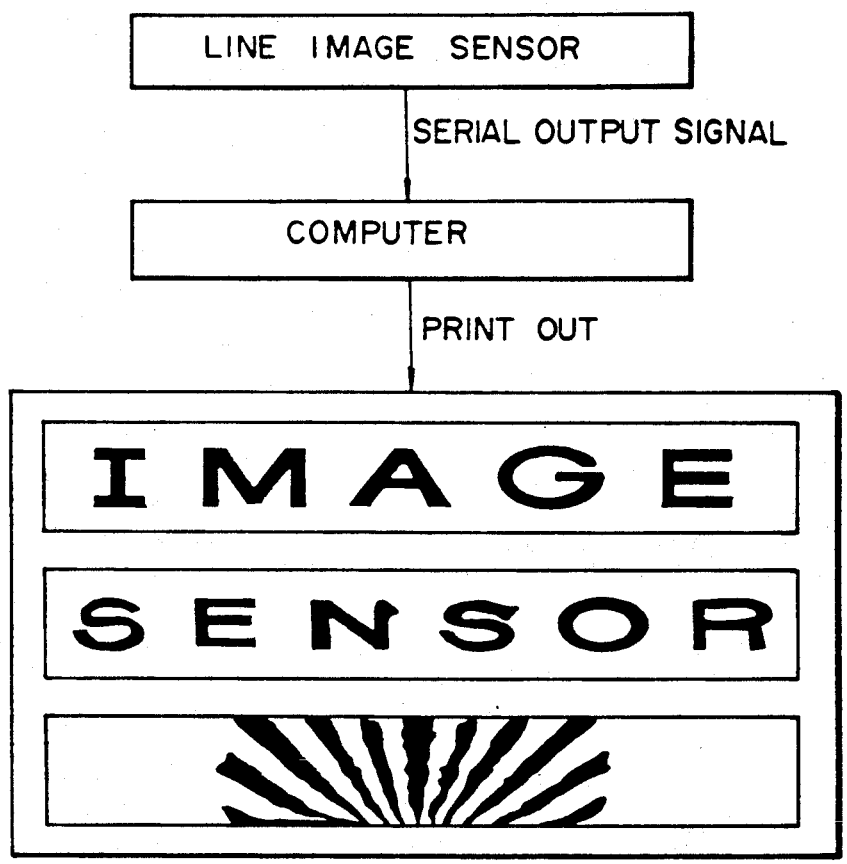
FIG. 12 shows a print-out procedure and a print-out image through the detection of negative film image.

FIG. 11 shows the variation in photo current and dark current plotted against the number of elements. As those skilled in the art will understand from these characteristics, the detecting sensitivity is sufficiently homogeneous for practical use. FIG. 12 shows a print-out procedure through the detection of the image by using the line image sensor shown in FIG. 5 and a microprocessor (computer). A printed-out image results wherein the read-out speed or the scanning velocity is 1 m sec/line.

As has been described according to the invention, the separation of the elements is made easier, a larger photo current is obtainable, and a higher density integration of the photosensor elements and a higher resolution may be realized as compared with conventional image sensors. Furthermore, due to the large photo current, the photo signal may be detected in the read-out circuit of the matrix driving system even using a small resistance as the load of the photosensor element.

Another embodiment resides in a photo detecting device having simplified structure and superior sensitivity. The foregoing embodiment improved sensitivity by employing interdigital electrodes. The present embodiment further improves sensitivity.

Figure 13:
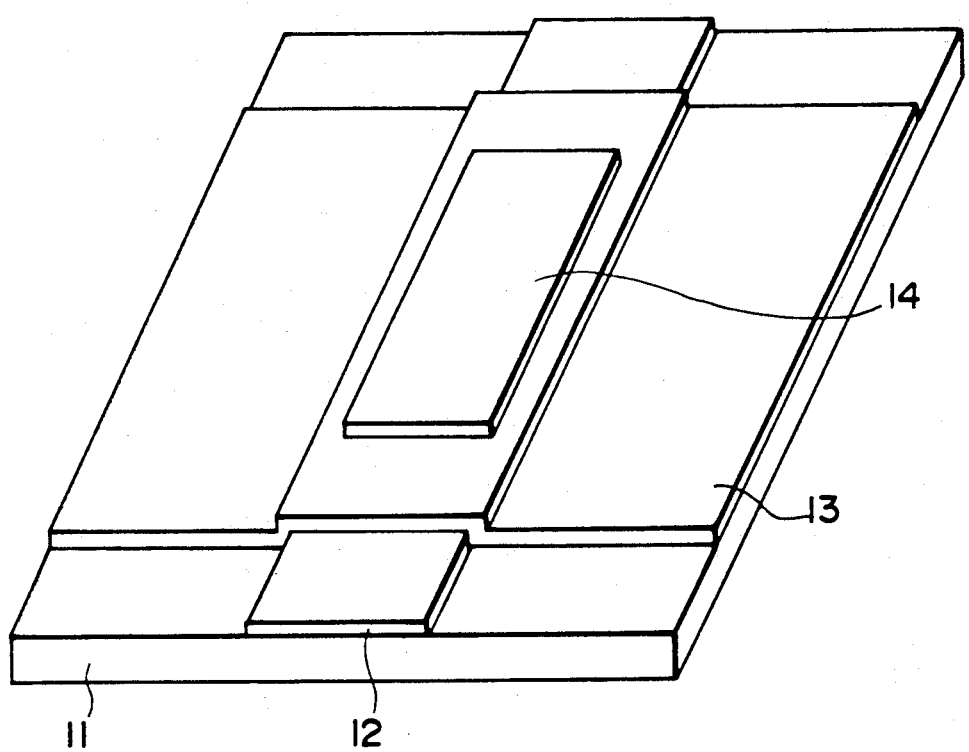
FIG. 13 shows a photosensor according to another embodiment of the invention.

Referring to FIG. 13, the image sensor according to this embodiment comprises a glass plate 11, a Cr thin film 12, a $Pb_2CrO_5$ thin film 13 and an Au thin film 14. The glass substrate 11 is a boric-silicic acid glass, for example, model No. 7059 made by Corning in the U.S.A. The Cr thin film 12 and the Au thin film 14 form a pair of electrodes. Manufacturing procedure of the image sensor are as follows.

The Cr thin film 12 is first formed on the glass substrate 11 by evaporation. Then, $Pb_2CrO_5$ thin film 13 is formed on the Cr thin film 12 by evaporation and heat treatment is performed. Finally, the Au thin layer 14 is formed on the $Pb_2CrO_5$ thin film 13 by evaporation. The Cr thin film 12 is evaporated on the glass substrate 11 using a spiral-type evaporation source. The Cr thin film 12 is about 2200 Å thick and is obtained by maintaining the vacuum level at $10^{-5}-10^{-4}$ Torr and flowing the current 60-70 A into the spiraltype source for 40-50 seconds.

$Pb_2CrO_5$ thin film 13 is about 3400 Å thick and is formed on the glass substrate 11 so as to cover the Cr thin film 12, while maintaining the vacuum level at $2.7 \times 10^{-7} - 6.0 \times 10^{-5}$ during the evaporation and the temperature of the glass substrate 11 at 300° C. After evaporation the heat treatment is executed in air to facilitate the growth and alignment of the crystal $Pb_2CrO_5$ thin film 13. This heat treatment is executed for 1.5 hours at 425° C. The Au thin film 14 is about 500 Å thick and is formed on the $Pb_2CrO_5$ thin film 13 by using a boat-type evaporation source, while maintaining the vacuum level below $10^{-5}$ Torr during the evaporation and flowing the current of 90-100 Å thereinto for 2-3 seconds.

This embodiment is a sandwich-type photo sensor device in which the $Pb_2CrO_5$ thin film 13 is sandwiched by the Cr thin film 12 and the Au thin film 14. The Au thin film 14 functions as the light receiving area. This kind of photosensor. device has the photovoltaic effect. Upon light illumination to the Au thin film 14 a voltage is applied between Cr thin film 12 and Au thin film 14, thereby, causing current to flow from Au thin film 14. In FIG. 13, an alternative photo sensing device may be realized by replacing the glass substrate 11, the Cr thin film 12, the $Pb_2CrO_5$ thin film 13 and the Au thin film 14 with a metal substrate, a $Pb_2CrO_5$ thin film, an insulator thin film such as $SiO_2$ and a metal electrode.

Figure 14:
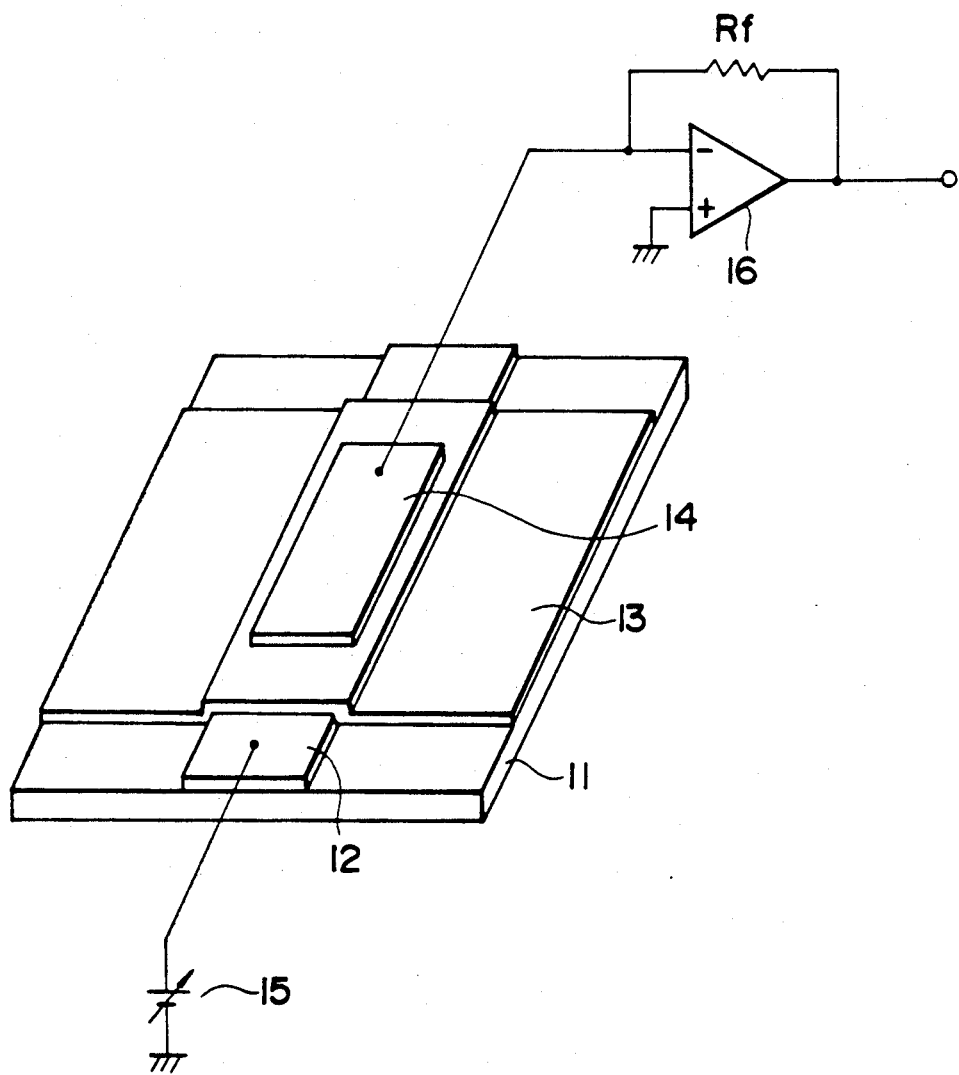
FIG. 14 shows a read-out means for the photosensor of FIG. 13.
Figure 15:
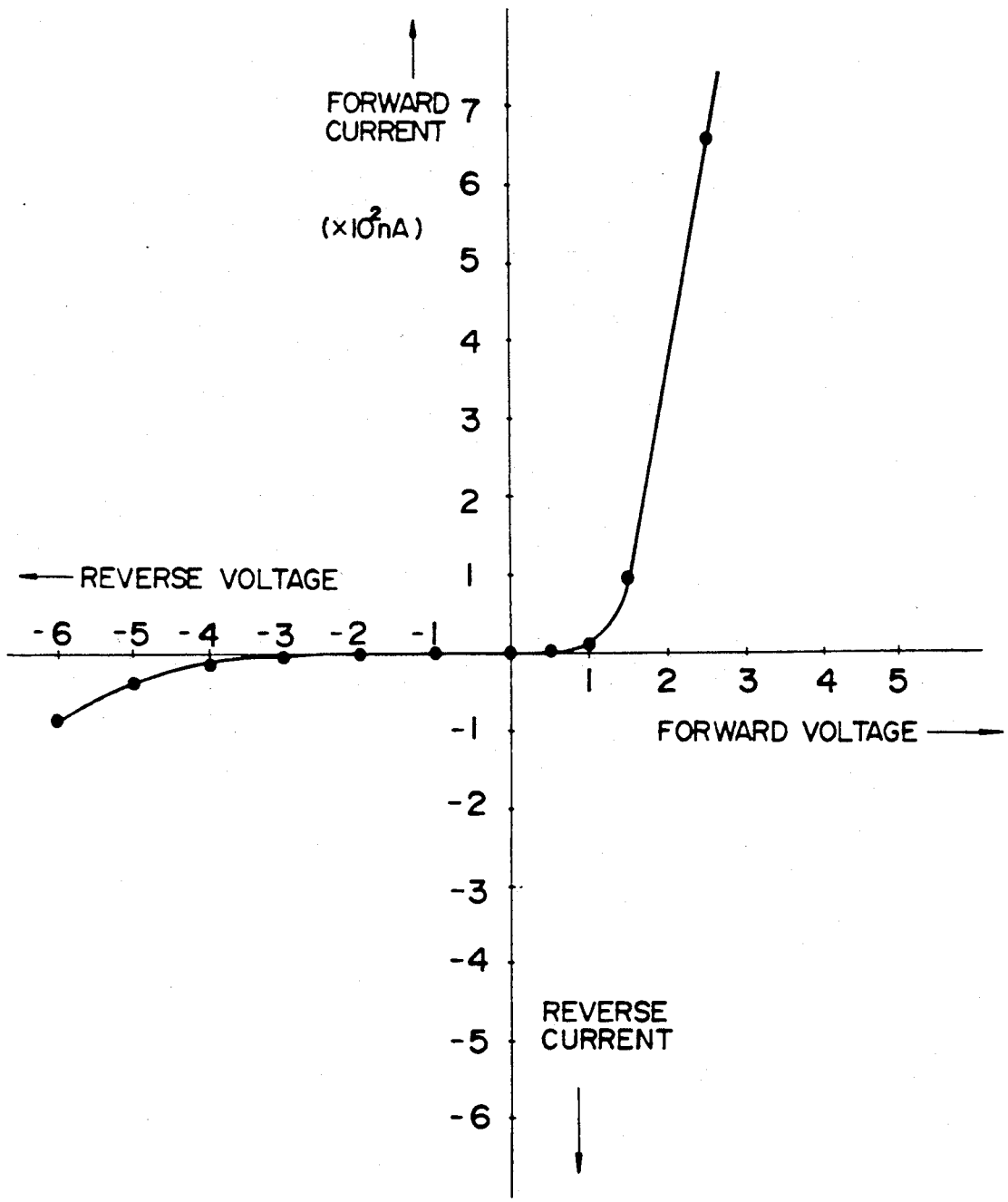
FIG. 15 shows the relationship between dark current and an applied voltage in the embodiment shown in FIG. 13
Figure 16:
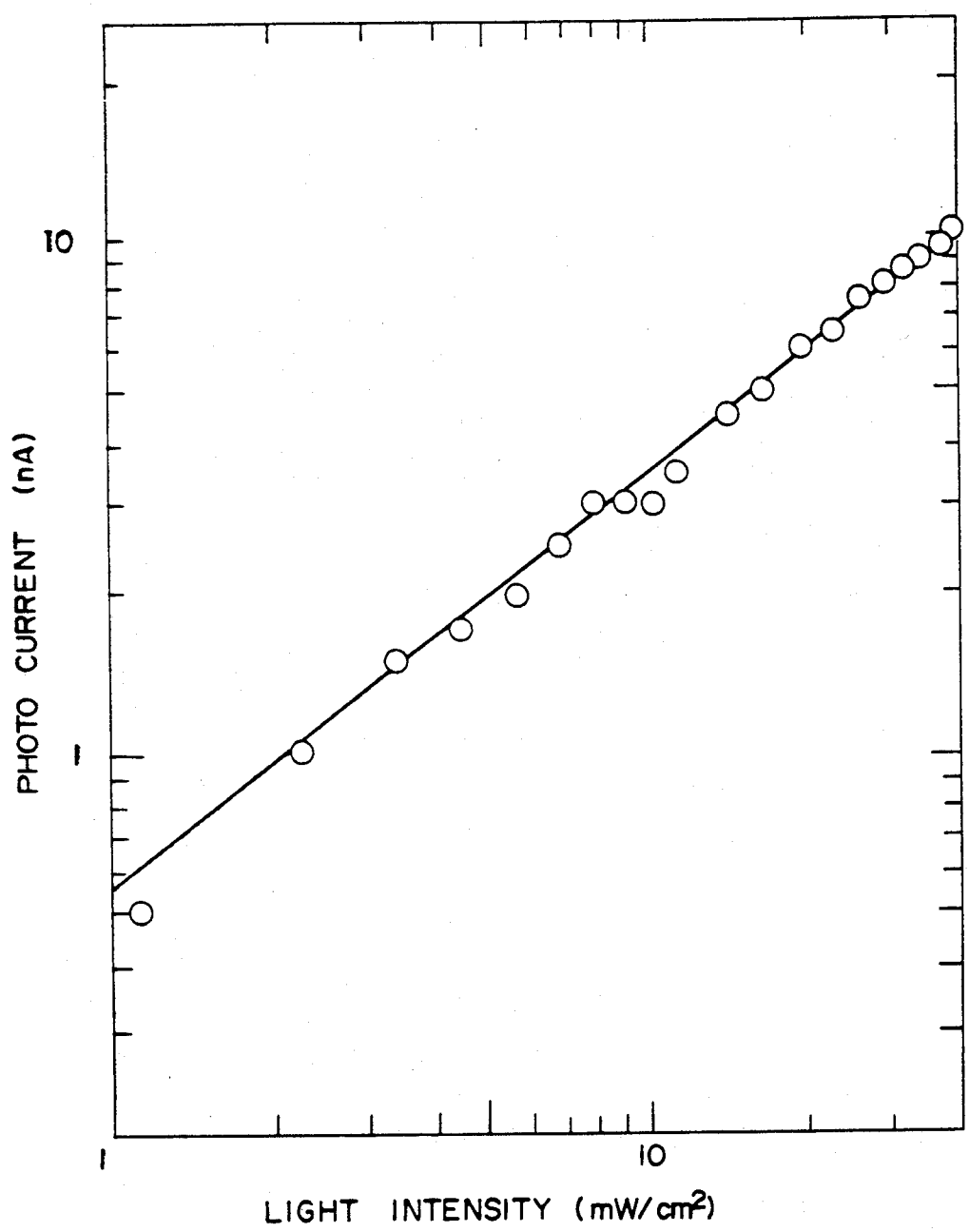
FIG. 16 shows the relationship between photo current and light intensity for the embodiment in FIG. 13.

FIG. 14 shows an optical signal detecting circuit using the embodiment shown in FIG. 13. FIG. 15 shows a characteristic curve of dark current plotted against applied voltage for the embodiment shown in FIG. 13. In FIG. 15, an applied "forward voltage" means that a negative voltage is applied to the Cr thin film 12 and an applied "reverse voltage" means that a positive voltage is applied to the Cr thin film 12. The forward current and the reverse current are those flowing into the thin film 14 and flowing out from the Au thin film 14, respectively. FIG. 16 shows a photo current plotted versus light intensity when a 0 voltage is applied to Cr thin film 12. A He—Ne laser (PMS Electro-Optics U.S.A.) made by Japan Laser Corporation, which emits a light of 5435 Å wavelength, is used as the light source. In FIG. 16, the photo current characteristic is linear for a range of 1-40 mW/cm², which indicates superior characteristic despite its simple element structure.

FIGS. 15 and 16 illustrate the operation of the sandwich-type photosensor device of this embodiment. The device functions as a photo diode having a cathode of Cr thin film 12 and an anode of Au thin film 14.

Although in the embodiment of FIG. 13, Cr thin film 12 and Au thin film 14 are employed to sandwich the $Pb_2CrO_5$ thin film 13, other combinations may be employed.

Figure 17:
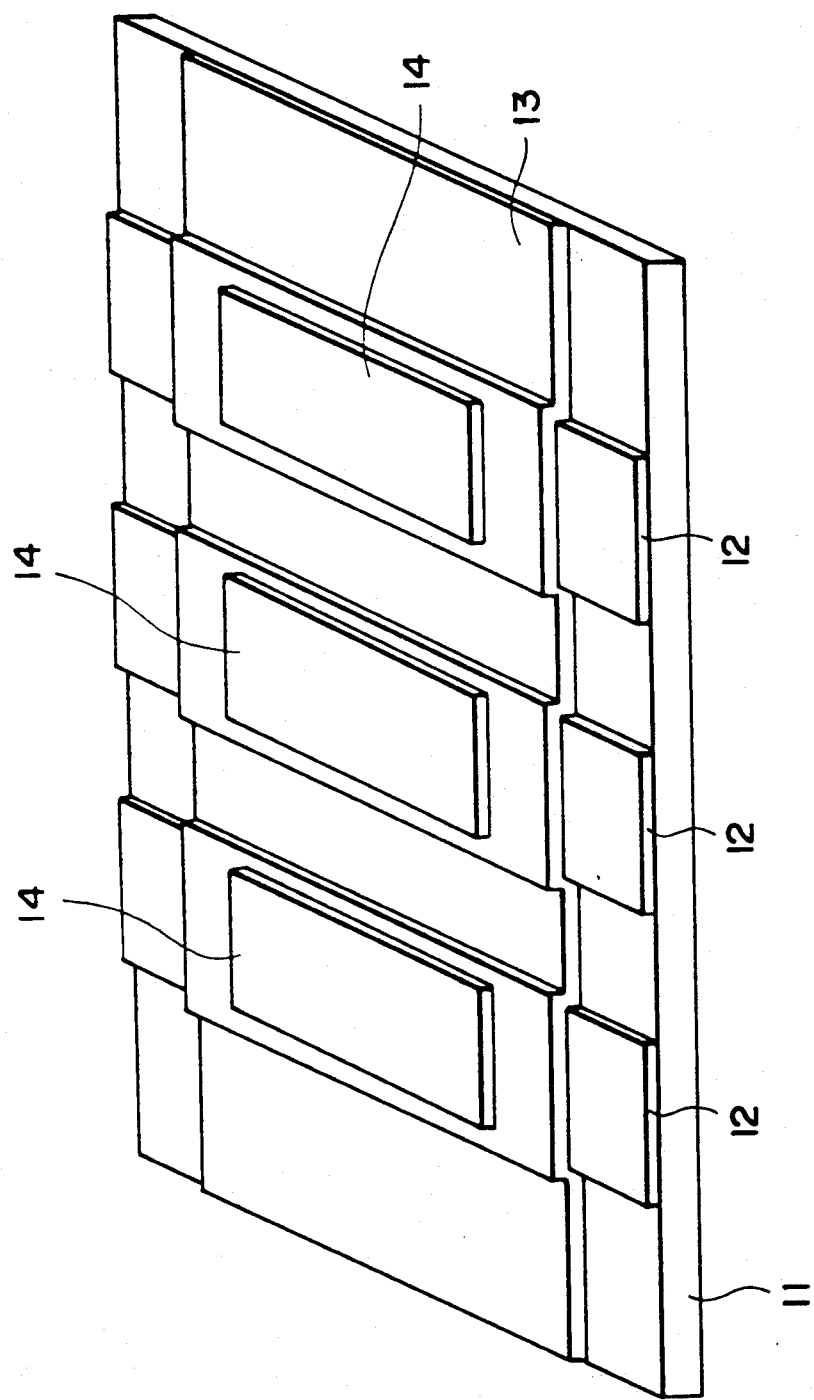
FIG. 17 shows another embodiment of the invention.

FIG. 17 is a perspective view of another embodiment which comprises glass substrate 11, Cr thin film 12, $Pb_2CrO_5$ thin film 13 and Au thin film 14. This embodiment has a structure in which three of the devices shown in FIG. 13 are disposed adjacent to each other with an equal interval between adjacent devices. The structure shown in FIG. 17 having the arrayed photosensor devices may operate as a line image sensor.

The photo detecting device according to the present invention has a simple structure of the sandwich-type in which the $Pb_2CrO_5$ thin film is sandwiched by two metal thin films. Therefore, the line image sensor in which the photo detecting elements are arranged adjacent to each other may be easily manufactured.

According to this embodiment, a photo sensor device having superior sensitivity characteristics and operating as a photo diode may be obtained. Due to the fast time response of the optical/electrical converting device comprised of the $Pb_2CrO_5$ thin film, a line image sensor having a high speed read-out characteristic may be realized.

Another embodiment of the present invention is directed to an optical/electrical converting (photosensor) element having high photo sensitivity.

As has been described, the $Pb_2CrO_5$ thin film is used in a photosensor array which provides a faster time response than 100 kHz. However, the contact-type line image sensor is comprised of $Pb_2CrO_5$ thin film and does not provide a sufficient photo current to drive the image sensor for operating the matrix driving system.

Figure 18:
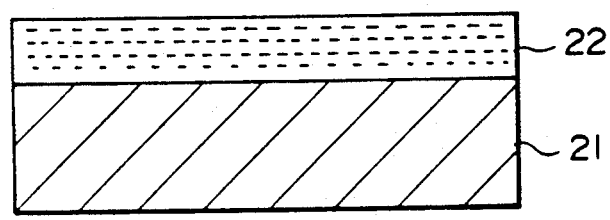
FIG. 18 shows a sectional view of a photosensor element according to the embodiment of the invention shown in FIG. 17.

In the embodiment, Au, Ag, Cu, Pb, Cr or S metal materials are diffused into the $Pb_2CrO_5$ thin film. FIG. 18 shows an Au-diffused $Pb_2CrO_5$ thin film 22 formed by diffusing Au into a $Pb_2CrO_5$ thin film 22 on glass substrate 21. The $Pb_2CrO_5$ thin film is fabricated on the substrate 21 by evaporating $Pb_2CrO_5$ ceramics, which is made by a solid phase reaction of PbO powder and $CrO_5$ powder, based upon the electron beam evaporation technique and the thin film is then subjected to a heat treatment. The condition of the evaporation is as follows: the vacuum level is $10^{-5} - 4 \times 10^{-5}$ Torr, the acceleration velocity of the electron beam, 2-4 KV; the beam current, 10 mA; the temperature of the glass substrate 1,300° C.; and the evaporation velocity, 130-160 Å/min. The obtained thin film is 0.16-0.20 $\mu$m thick. The heat treatment is executed at 425° C. for two hours. Au of 400 Å in thickness is evaporated on the $Pb_2CrO_5$ thin film, the evaporated film is subjected to the heat treatment for the diffusion at 400° C. for six hours.

Figure 19:
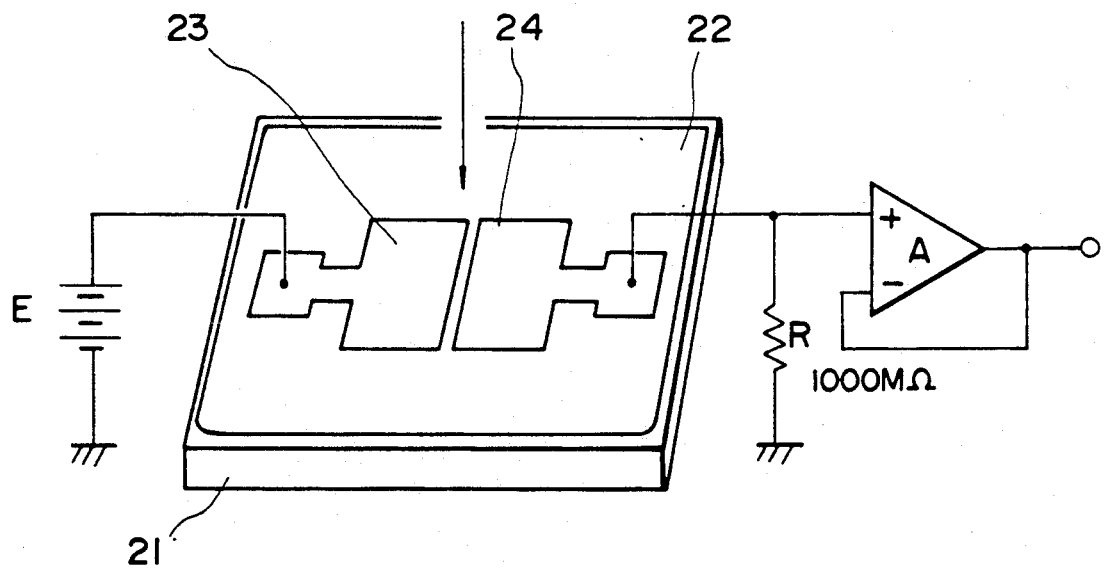
FIG. 19 shows a photosensor according to an embodiment of the invention.

FIG. 19 shows a representative optical/electrical converting device in accordance with this embodiment. A pair of Au electrodes 23, 24 are formed on the Au-diffused $Pb_2CrO_5$ thin film 22 on the glass substrate 21. The Au electrodes 23, 24 are opposed to each other and have a gap therebetween which is 0.2 mm in width and 2.0 mm in length. The gap portion therebetween is an effective light receiving portion. Upon light illumination into the effective light receiving portion under an applied bias voltage E, current flows between Au electrodes 23 and 24. The optical current from the Au electrode 24 is converted into a voltage signal through a load resister R of 100 M$\Omega$ and is detected by an operational amplifier A having a high input impedance and low input bias current characteristics. The detecting circuit comprised of the load resistor R and the operational amplifier A has detection capability of 1 mV for 1 pA photo current. Using such a detecting circuit with a low pass filter, a current of 0.001 pA may be detected.

Figure 20:
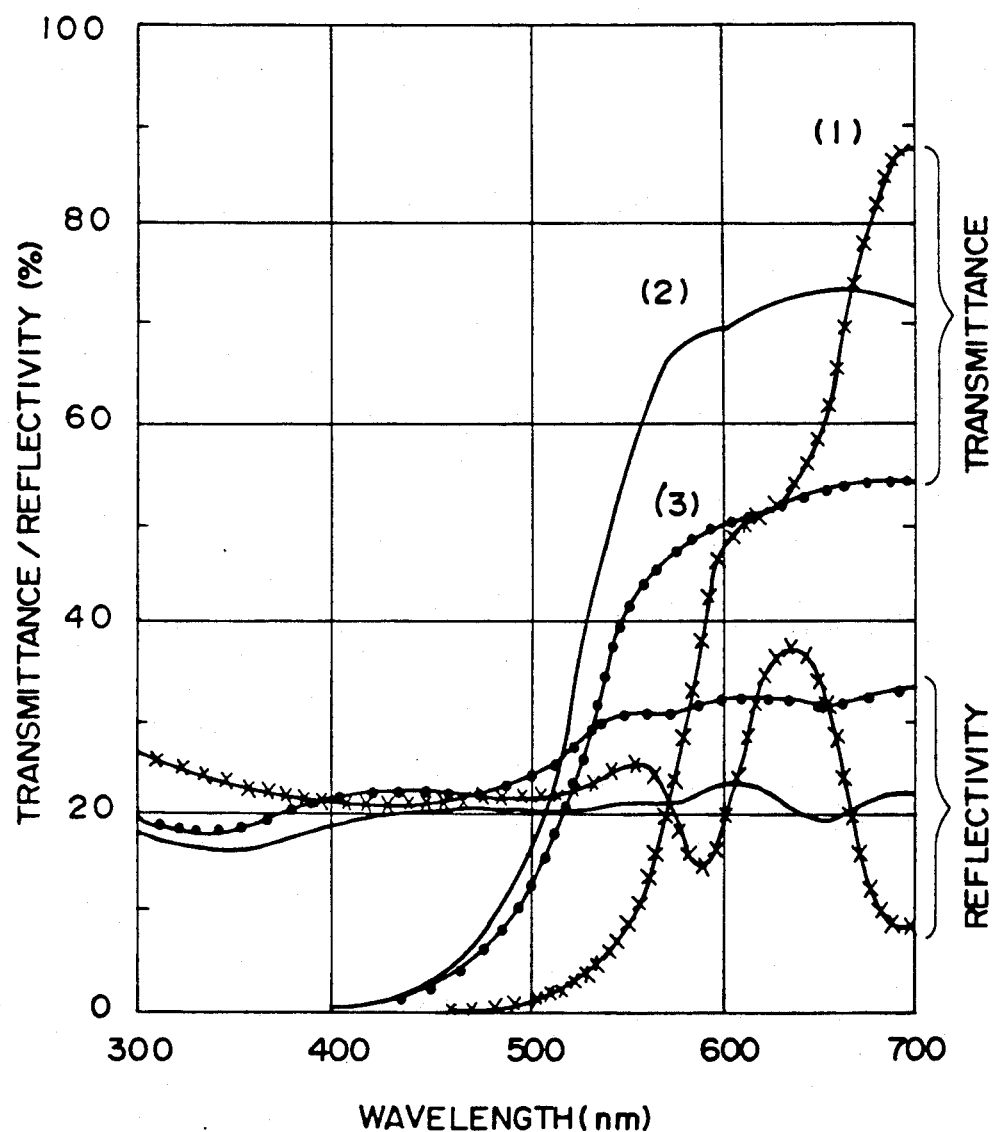
FIG. 20 shows the relationship between transmittance/reflectivity and wavelength for the Au-diffused Pb$_2$CrO$_5$ thin film photosensor element of FIG. 18, for the thin film obtained immediately after evaporation and for the thin film obtained after heat treatment.

FIG. 20 shows transmittance and reflectivity characteristics versus light wavelength for the Au-diffused, $Pb_2CrO_5$ thin film 22. Also shown are transmittance and reflectivity characteristics for $Pb_2CrO_5$ thin films obtained immediately after evaporation on the glass substrate 21 and after heat treatment. The transmittance increases rapidly as the light wavelength changes for all of the thin films. The wavelength at which the transmittance rises for the thin film immediately after evaporation is about 60 nm more than the wavelength for the other two thin films. An analysis by the X-ray diffraction method and the Raman scattering method indicates that the crystallinity of the thin film obtained immediately after the evaporation is large, while the crystal structure is deflected from the original $Pb_2CrO_5$. It is seen that the transmittance and reflectivity of the thin film obtained immediately after the evaporation largely fluctuates for varying light wavelength. This is due to the influence of multi-reflection caused between the glass substrate and the boundary surface of the glass substrate and the thin film surface, and represents the flatness of the thin film surface. In contrast, the fluctuation of the transmittance and reflectivity for the thin film obtained after the heat treatment becomes small, indicating an unevenness of the thin film surface. The Au-diffused $Pb_2CrO_2$ thin film 22 shows almost the same transmittance and reflectivity characteristics as those for the thin film obtained after the heat treatment. The analysis by the X-ray diffraction method has obtained the most similar diffraction pattern and it is understandable that the Au-diffused $Pb_2CrO_5$ thin film 22 maintains the original crystal structure of $Pb_2CrO_5$. It should be noted that the Au-diffused $Pb_2CrO_5$ thin film 22 has different transmittance and reflectivity from that of the thin film obtained after the heat treatment. The Au-diffused $Pb_2CrO_5$ thin film 22 has a reduced transmittance by 30% and an increased reflectivity by 40% as compared to the thin film obtained after the heat treatment.

Figure 21:
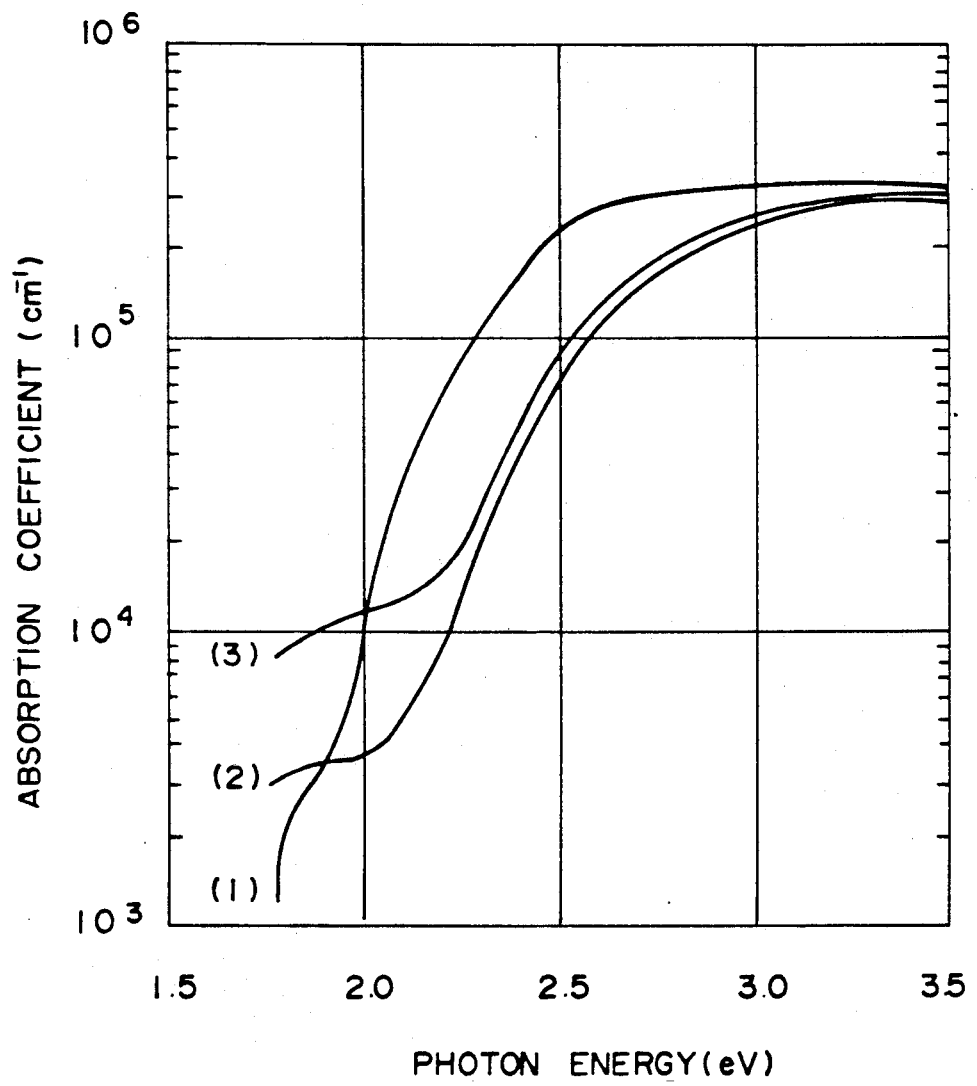
FIG. 21 shows the relationship between the absorption coefficient and photon energy for the thin films of the embodiment shown in FIG. 19.
Figure 22:
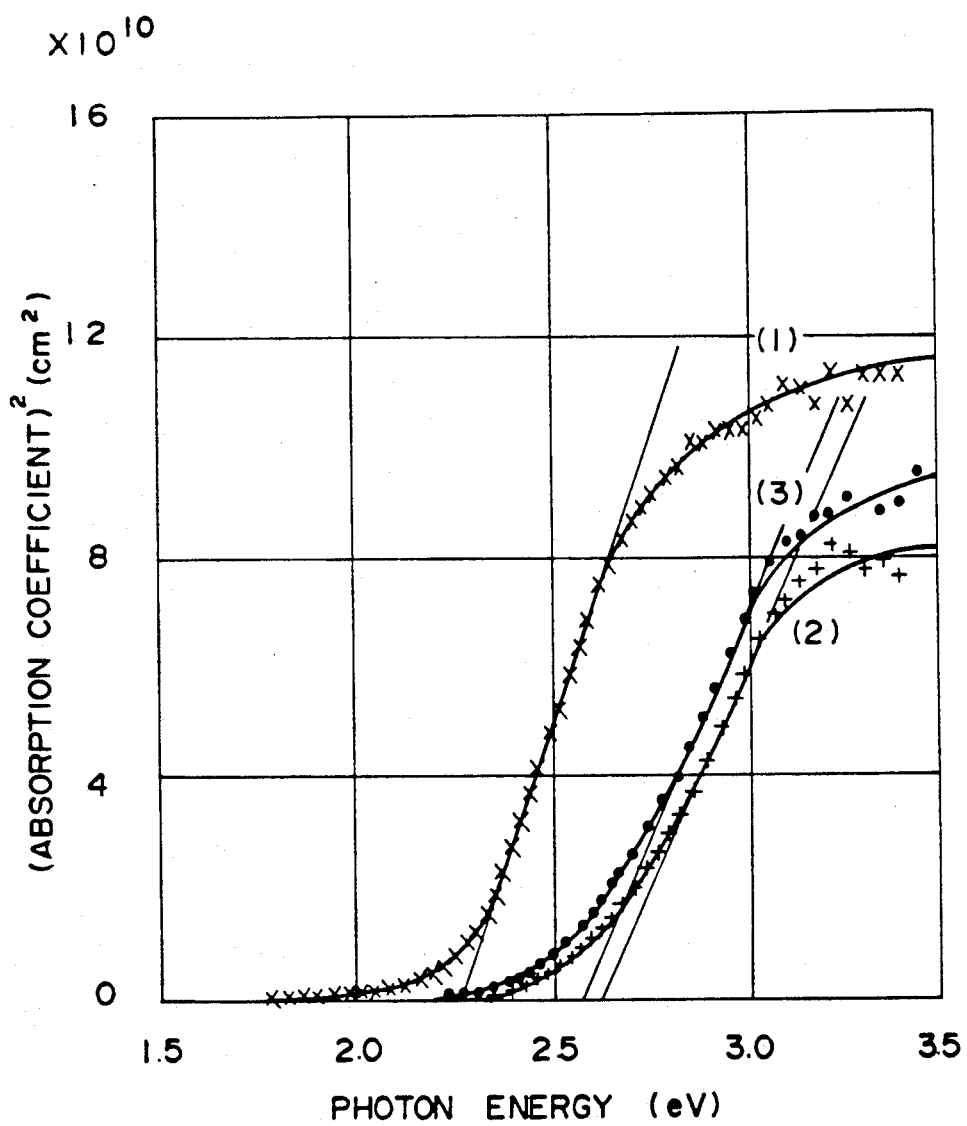
FIG. 22 shows the relationship between a square of the absorption coefficient and a photon energy for the films of FIG. 20.

FIG. 21 shows characteristic curves representing the relationship between a light absorption coefficient and photo energy, calculated based upon the characteristics shown in FIG. 20 and the thin film thickness. Although the Au-diffused $Pb_2CrO_5$ thin film 22 indicates almost the same absorption characteristic in the photon energy range higher than 2.3 eV as those of the thin film obtained immediately after the evaporation and after the heat treatment, the difference of the absorption coefficients in a range smaller than 2.3 eV is large. Each thin film indicates similar characteristics to that of a direct transition-type semiconductor. For the direct transition-type semiconductor an optical band gap energy is obtainable from the relationship between the square of the absorption coefficient and the photon energy. FIG. 22 shows the relationship, for each thin film, between the square of the absorption coefficient and the photon energy. Since each thin film characteristic is similar to that of the semiconductor, the band gap energy may be obtained from FIG. 22. The obtained energy is 2.26 eV for the thin film obtained immediately after the evaporation; 2.59 eV for that obtained after the heat treatment; and 2.56 eV for the Au-diffused $Pb_2CrO_5$ thin film 22.

In FIG. 23, the optical/electrical conversion characteristics are given for Au-diffused $Pb_2CrO_5$ thin film 22 (of FIG. 19) and $Pb_2CrO_5$ thin film without Au. FIG. 23 shows characteristics of six materials with parameters such as photo current, dark current, photo current/dark current ratio, $\tau$ coefficient, V-I characteristics and film thickness. The $\tau$ coefficient is an inclination of the characteristic line of a logarithmic light intensity with a logarithmic photo current. The photo current was obtained under the conditions of 40 V DC bias voltage, 543.5 nm wavelength, and 10 mW/cm$^2$ light intensity of He—Ne laser light. The photo current obtained by the thin film optical/electrical converting device of FIG. 19 increases 11 to 150 times as large as that of the thin film without Au, indicating that the Au-diffusion into the Pb$_2$CrO$_5$ thin film is extremely effective for increasing the photo current. The dark current was measured under the application of 40 V DC bias voltage, the same as that for the photo current. It can be seen that there is no significant difference in the ratio of photo current/dark current between the materials including Au and that without Au.

Figure 24:
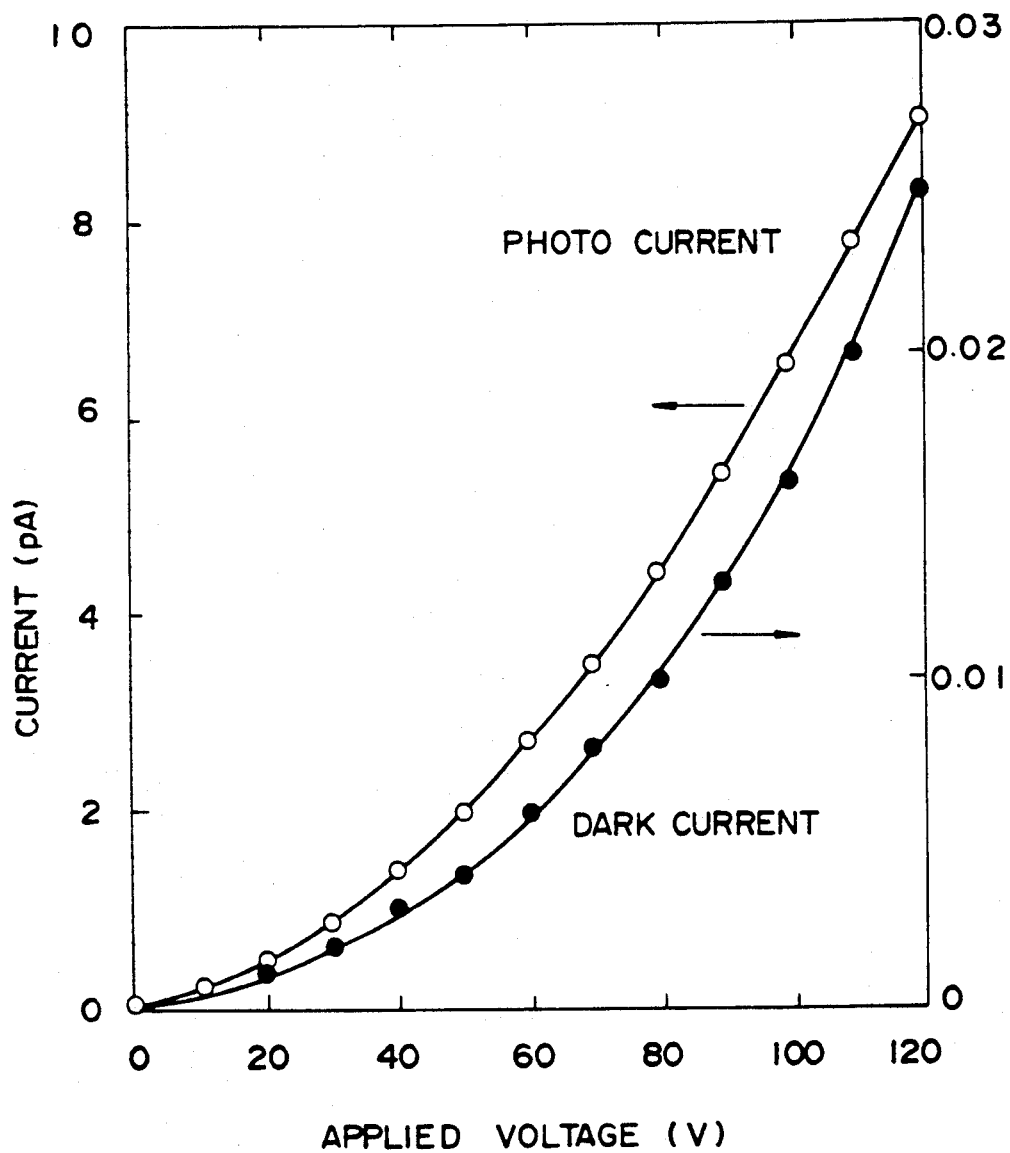
FIG. 24 shows the relationship between photo current/dark current for an applied voltage, for the $Pb_2CrO_5$ thin film without Au.
Figure 25:
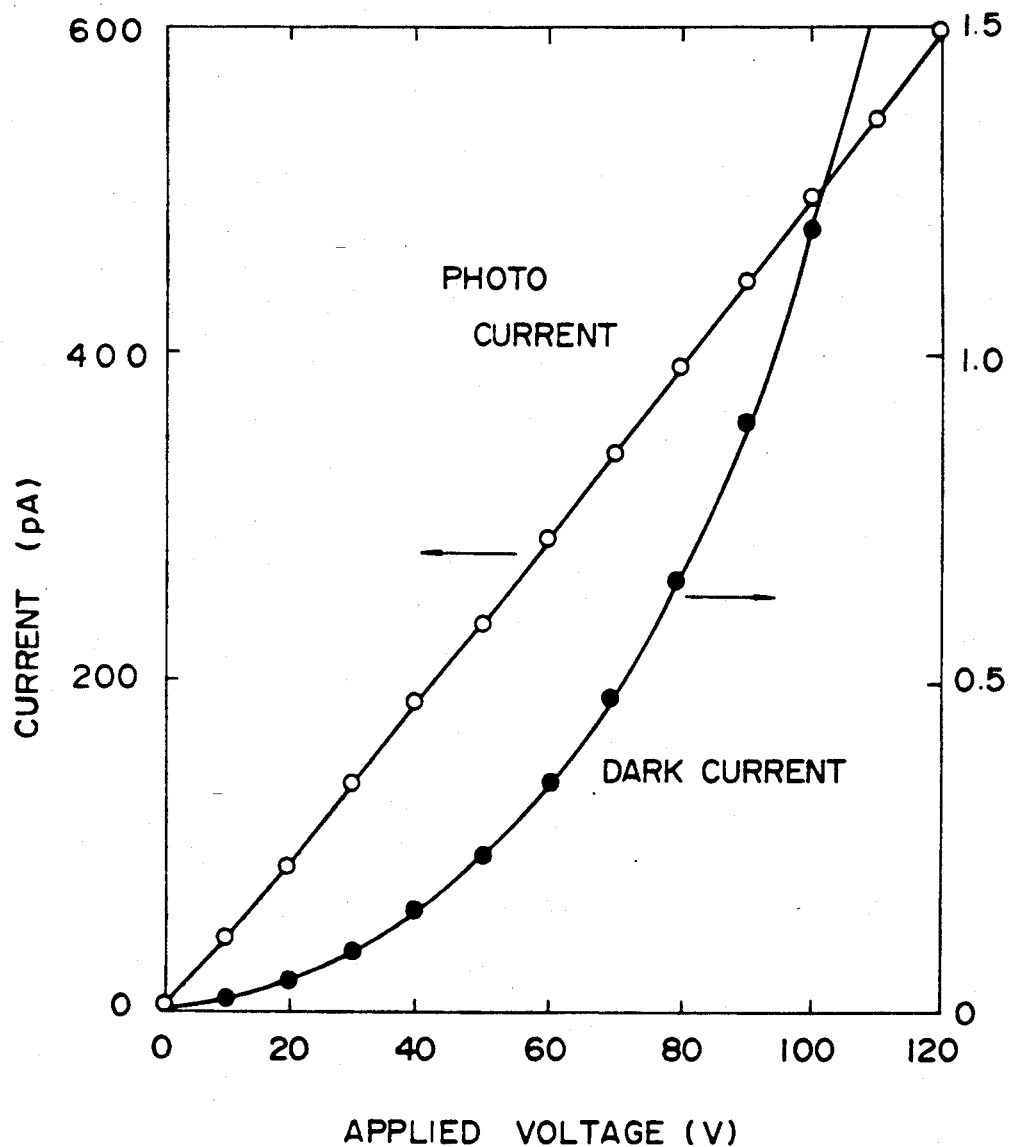
FIG. 25 shows the relationship between a photo current/dark current for an applied voltage, for the Au-diffused $Pb_2CrO_5$ thin film.
Figure 26:
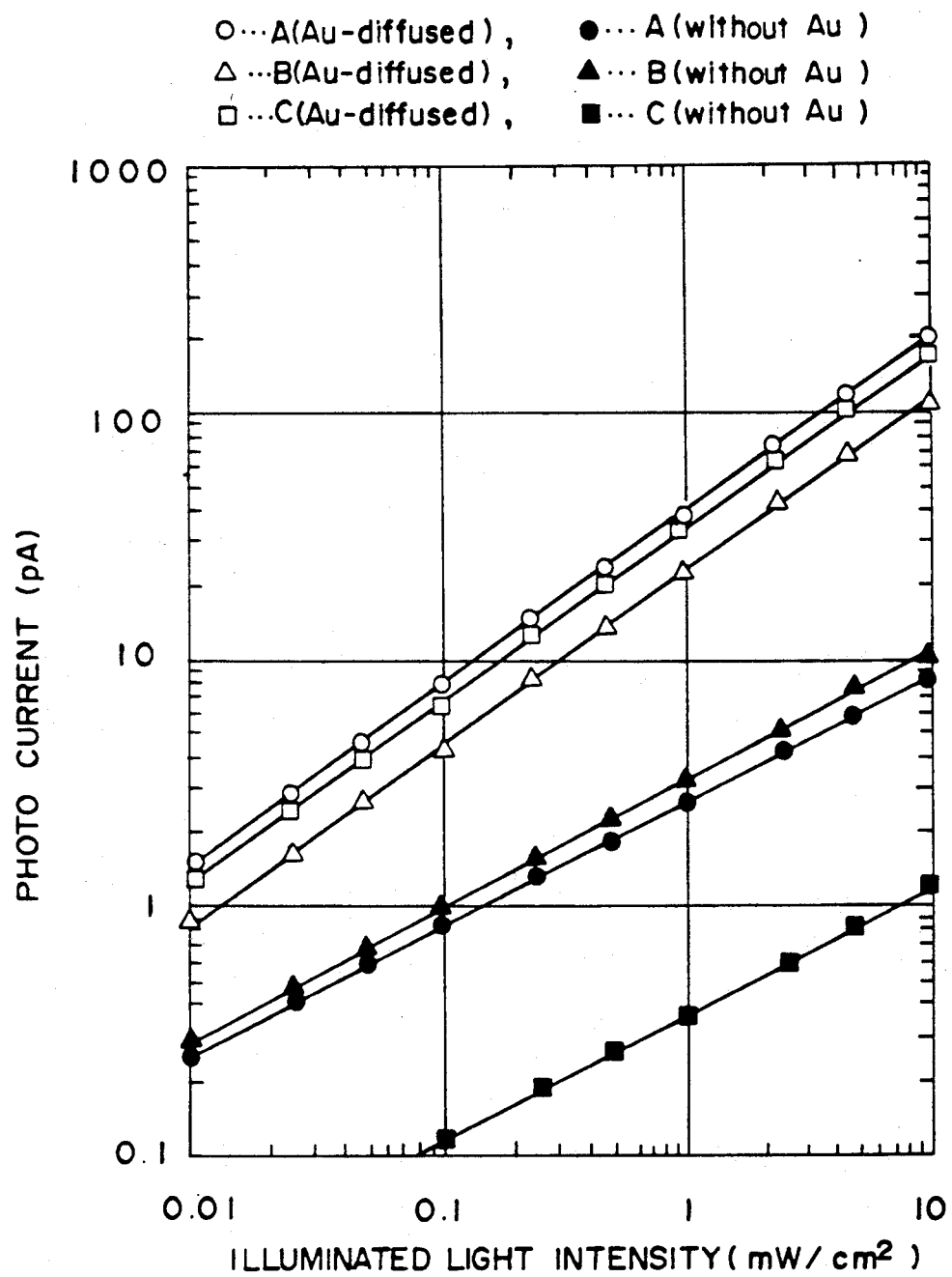
FIG. 26 shows the relationship between a photo current and an illuminated light intensity for the devices A, B, and C employing the Au-diffused thin film and the thin film without Au.

FIGS. 24 and 25 show characteristic curves of the photo current and the dark current plotted versus applied bias voltage for the thin film without Au and the Au-diffused Pb$_2$CrO$_5$ thin film, respectively, i.e., the material C of FIG. 26. Similar results were measured for the materials A and B of FIG. 26. FIG. 24 shows that the photo current and the dark current increase with increases in the applied voltage for the thin film without Au and that there is a superlinear relationship therebetween. In FIG. 25 only the dark current has the superlinear relationship with increases in the applied voltage for the Au-diffused Pb$_2$CrO$_5$, but the photo current has a linear relationship with increases in the applied voltage. The superlinear relationships in FIGS. 24 and 25 result from the optical/electrical conversion characteristics of the contact between the Au and Pb$_2$CrO$_5$ in the device. The linear bias voltage dependence of the photo current in FIG. 25 also indicates that the photo conductive phenomena primarily controls the characteristic for the Au-diffused Pb$_2$CrO$_5$ thin film 22.

FIG. 26 shows the relationship between the logarithmic illuminated light intensity and the logarithmic photo current for the materials A, B, C of the Au-diffused Pb$_2$CrO$_5$ thin film and the Pb$_2$CrO$_5$ thin film without Au. The $\tau$ value of 0.5 was obtained for the materials A, B, and C without Au and $\tau$ of 0.7, for the Au-diffused material. It is understood that the $\tau$ value increases from 0.5 to 0.7 by diffusing Au. Although the characteristics in FIG. 26 are given for a 543.5 nm wavelength, similar characteristics were measured from 350 nm and 450 nm wavelengths.

Figure 27:
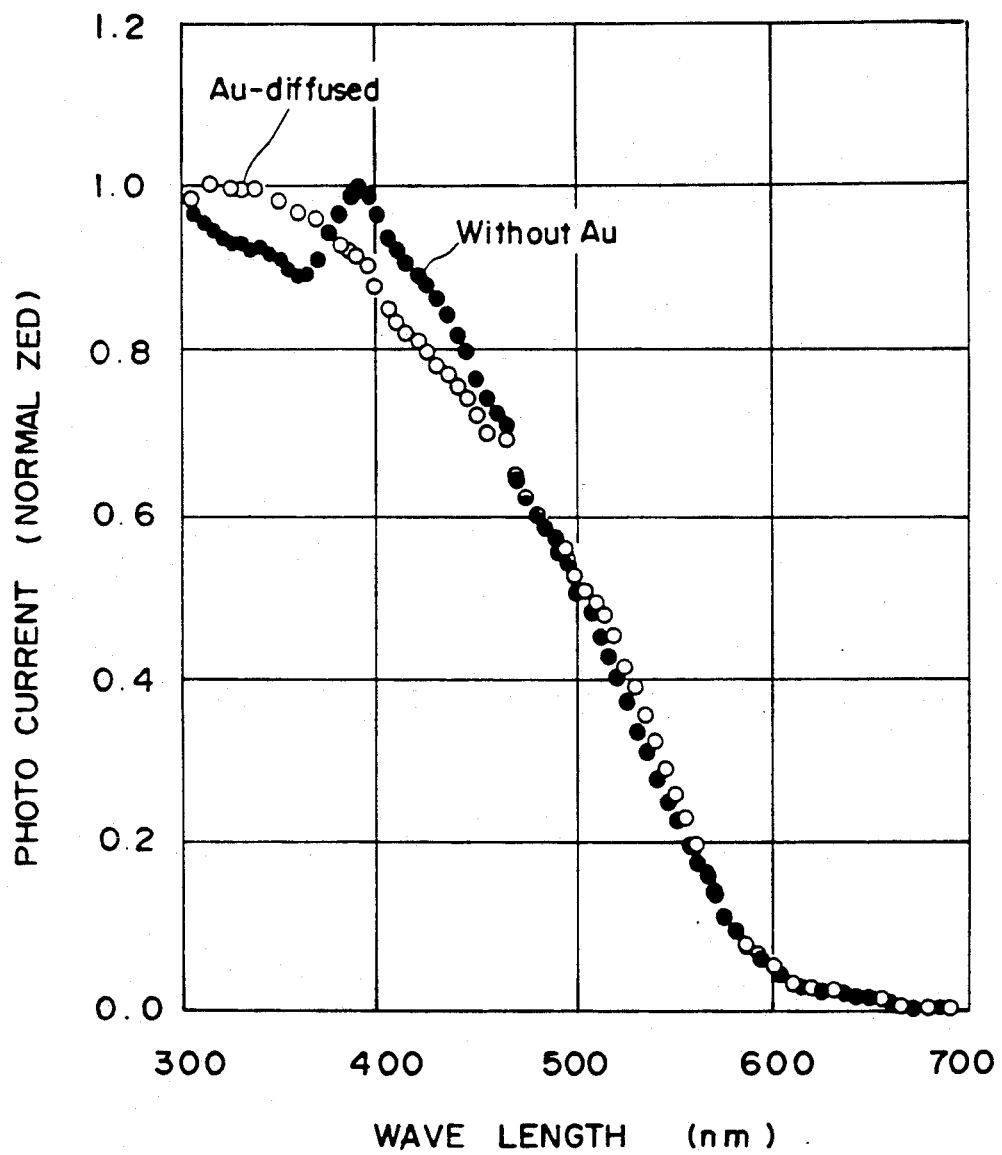
FIG. 27 shows spectrum sensitivity for devices employing the Au-diffused thin film and the thin film without Au.

FIG. 27 is a spectrum sensitivity characteristic of the device using the material C of FIG. 26, within a range from the visible region to the near ultraviolet region. The photo current of the longitudinal axis is normalized by the maximum value thereof because the photo sensitivity of the Au-diffused Pb$_2$CrO$_5$ thin film greatly differs from the thin film without Au. The spectrum sensitivity for both devices rises around 580 nm and has a large value for the shorter wavelength. This corresponds to the characteristic of the absorption coefficient of the thin film. The device using the Au-diffused Pb$_2$CrO$_5$ thin film 22 has higher sensitivity for the near ultraviolet region than that for the visible region, while the device without Au has a relatively lower sensitivity for the near ultraviolet region than that for the visible region.

According to the invention, a photo sensitivity 150 times (maximum) as large as that of the device without Au is obtainable, while maintaining the characteristics of the spectrum sensitivity and the photo current/dark current ratio for the device without Au. The dependency of the photo current upon the bias voltage is changed from the superlinear relationship to the linear relationship by the Au diffusion and $\tau$ coefficient (value), from 0.5 to 0.7. Therefore, the thin film optical/electrical converting device even integrated in high density as the fitting-type line image sensor can be driven by the matrix driving system, thereby miniaturizing the driving circuit.

It should be noted that the above described photosensor element may be utilized for the foregoing embodiments.

The next embodiment of the invention is directed to an improvement in color sensitivity, especially red color sensitivity. It has been experimentally confirmed that the foregoing device using Pb$_2$CrO$_5$ does not have sufficient color sensitivity adaptable for a color facsimile apparatus. Therefore, an optical/electrical converting device is required which makes it easy to contract a large area thin film and yet have high sensitivity over all of the visible range including blue, green and red color regions.

Figure 28:
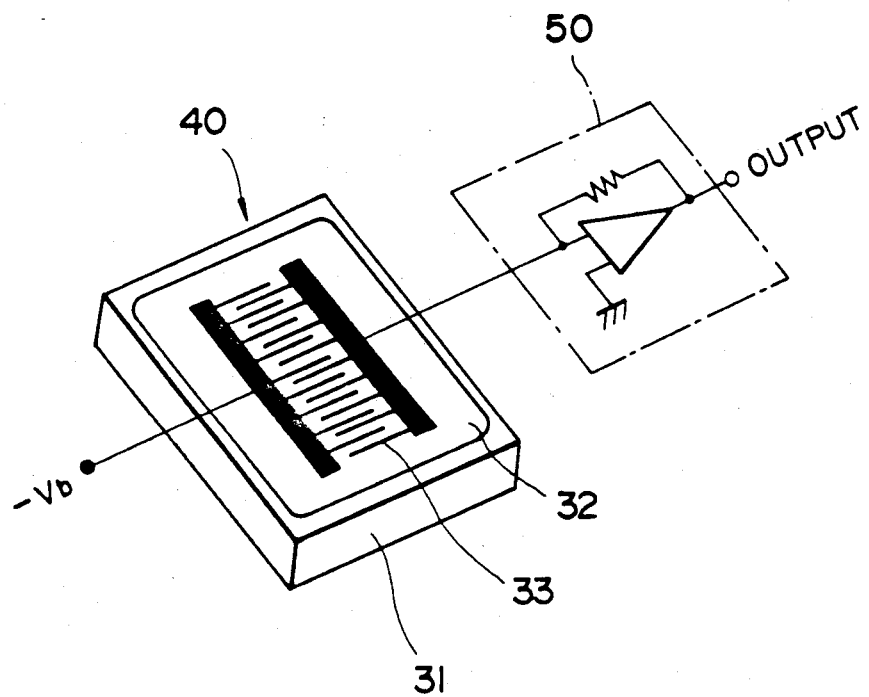
FIG. 28 shows a photo sensing device according to another embodiment of the present invention.

This embodiment employs an oxide in Group III elements Pb$_5$CrO$_8$ instead of Pb$_2$CrO$_5$. FIG. 28 Pb$_5$CrO$_8$ thin film 32 formed by the electron-beam evaporation technique on a glass substrate 31. As the evaporation source a disk-like Pb$_5$CrO$_8$ ceramic of 15.65 mm in diameter and 2.50 mm in thickness is employed. The vacuum level and the temperature of the glass substrate 31 are below $2 \times 10^{-5}$ Torr and 300° C., respectively. The evaporation speed is 130-220 Å/min and the formed film thickness is about 4000 Å. After evaporation, heat treatment at 325° C. is executed in air to facilitate the crystal growth and arrangement of the thin film.

Au interdigital fine electrodes 33 of 30 pairs are formed on the Pb$_5$CrO$_8$ thin film with an interval of 200 $\mu$m. A pair of electrodes 33 are opposed to each other with a minute gap. Upon light illumination of the electrode 3, to which a predetermined voltage is applied, the electric conductivity of the gap portion of the Pb$_5$CrO$_8$ thin film increases to cause current flow. An output current of optical/electrical converting element 40 is amplified by a current detecting circuit 50. The amplified current is converted into a voltage signal by a current/voltage converter and is detected as photo detection information.

Figure 29:
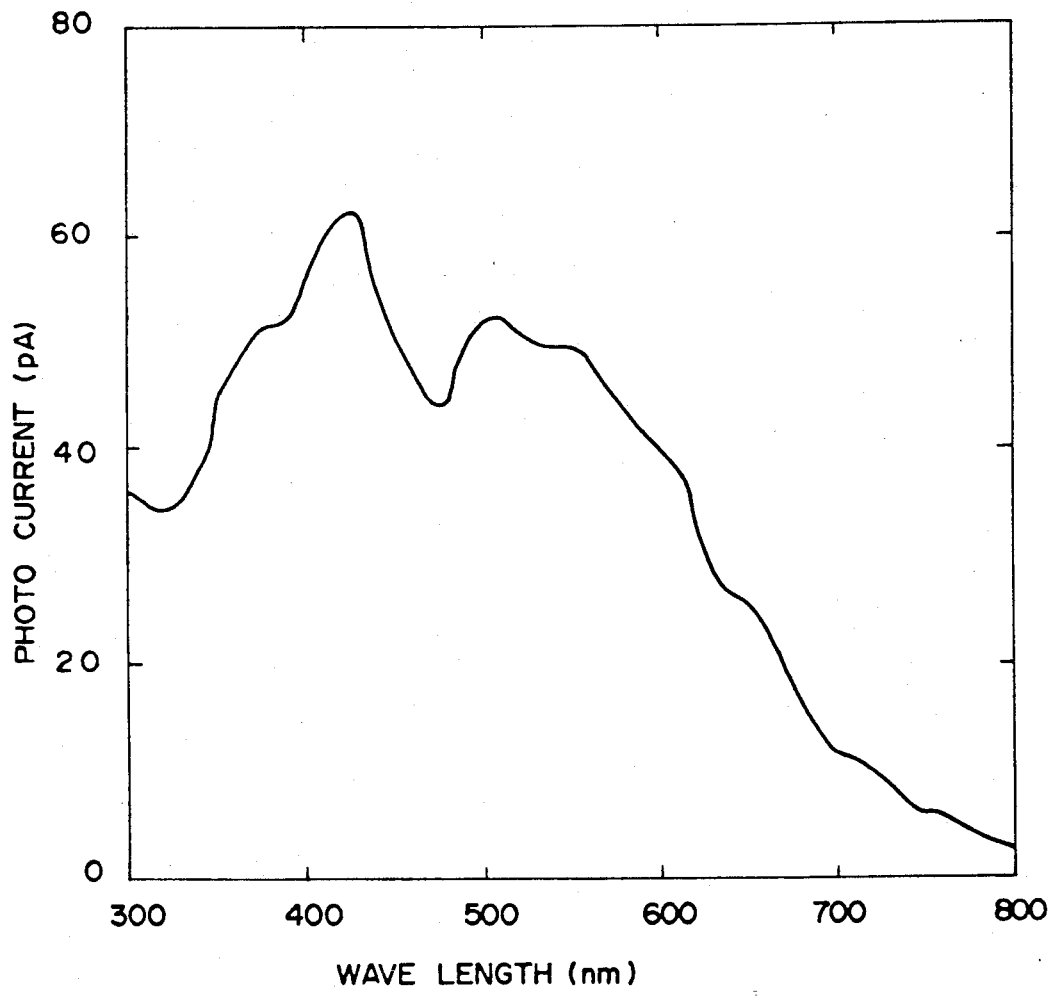
FIG. 29 shows the relationship between photo current and wavelength.

As can be seen from FIG. 29 showing spectrum sensitivity, a high sensitivity is obtained over a wide range from 400 nm (violet) to 770 nm (red), which is useful for the photo detector. From the experiment, ratios $I_p/I_d$ of 104.7 and 48.5 at wavelengths 430 nm and 630 nm are obtained, respectively, which are sufficient values for use as the conversion element.

The experiments show that the useful elements are obtained by heat treatment of Pb$_5$CrO$_8$ thin film 32 at 350° C. and 375° C. and by evaporation of the thin film 32 with the substrate temperature around 300° C. The photosensor element of the Pb$_5$CrO$_8$ may be employed in the foregoing structure of the embodiments.

Although the invention has been described with respect to specific embodiments, it should be obvious that there are numerous variations within the scope of the present invention. For example, the above description has referred to the material for the photosensor elements of Pb$_2$CrO$_5$ and Pb$_5$CrO$_8$. They may be manufactured by the reaction of PbO and Cr$_2$O$_3$ material and the present inventor has experimentally confirmed that PbO·Cr$_2$O$_3$ compound material (thin film) may generally be employed as the photosensor element. Thus, the present invention is intended to cover not only the described embodiments, but also those variations falling within the scope of the appended claims.

What is claimed is:

1. A photosensor comprising:
   a $Pb_2CrO_5$ thin film formed on a substrate; and
   a plurality of interdigital electrodes made of an Au thin film formed on said $Pb_2CrO_5$ thin film, said plurality of interdigital electrodes having a gap therebetween, wherein Au material of said Au thin film is diffused into said $Pb_2CrO_5$ thin film.

2. A photosensor as in claim 1, said interdigital electrodes comprising a first comb-like electrode group and a second comb-like electrode group, said first and second comb-like electrode groups being electrically separated and being supplied with a predetermined voltage.

3. A photosensing device comprising:
   a Cr thin film;
   an Au thin film; and
   a $Pb_2CrO_5$ thin film disposed between said Cr thin film and said Au thin film wherein Au material of said Au thin film is diffused into said $Pb_2CrO_5$ thin film.

4. A photosensing device comprising:
   a plurality of photosensor elements, each photosensor element including a first electrode, a second electrode and a $Pb_2CrO_5$ thin film disposed between said first and second electrodes, said plurality of photosensor elements being arranged in a line, said first electrode being made of a Cr thin film and said second electrode being made of an Au thin film wherein Au material of said Au thin film is diffused into said $Pb_2CrO_5$ thin film.

5. A photosensor comprising:
   a $Pb_2CrO_5$ thin film formed on a substrate; and
   a plurality of interdigital electrodes made of a metal thin film formed on said $Pb_2CrO_5$ thin film, said plurality of interdigital electrodes having a gap therebetween, wherein said metal thin film is any one of Au, Ag, Cu, Pb, Cr and S and is diffused into said $Pb_2CrO_5$ thin film.

6. A photosensor as in claim 5, said interdigital electrodes comprising a first comb-like electrode group and a second comb-like electrode groups, said first and second comb-like electrode groups being electrically separated and being supplied with a predetermined voltage.

7. A photosensing device comprising:
   a first metal thin film;
   a second metal thin film; and
   a $Pb_2CrO_5$ thin film disposed between said first and second metal thin films wherein said first metal thin film is any one of Au, Ag, Cu, Pb, Cr and S and said first metal thin film is diffused into said $Pb_2CrO_5$ thin film.

8. A photosensing device comprising a plurality of photosensor elements, each photosensor element including a first electrode, a second electrode and a $Pb_2CrO_5$ thin film disposed between said first and second electrodes, said plurality of photosensor elements being arranged in a line, said first electrode being made of any one of Au, Ag, Cu, Pb, Cr and S and diffused into said $Pb_2CrO_5$ thin film.

9. A photosensor comprising:
   a semi-insulating $Pb_5CrO_8$ thin film formed on a substrate; and
   a plurality of interdigital electrodes of an Au thin film formed on said $Pb_5CrO_8$ thin film, said plurality of interdigital electrodes having a gap therebetween, wherein Au material of said Au thin film being diffused into said $Pb_5CrO_8$ thin film.

10. A photosensor as in claim 9, said interdigital electrodes comprising a first comb-like electrode group and a second comb-like electrode group, said first and second comb-like electrode groups being electrically separated and being supplied with a predetermined voltage.

11. A photosensing device comprising:
    a Cr thin film;
    an Au thin film; and
    a $Pb_5CrO_8$ thin film disposed between said Cr thin film and said Au thin film wherein Au material of said Au thin film is diffused into said $Pb_5CrO_8$ thin film.

12. A photosensing device comprising a plurality of photosensor elements, each photosensor element including a first electrode, a second electrode and a $Pb_5CrO_8$ thin film disposed between said first and second electrodes, said plurality of photosensor elements being arranged in a line, said first electrode being made of a Cr thin film and said second electrode being made of an Au thin film wherein Au material of said Au thin film is diffused into said $Pb_5CrO_8$ thin film.

13. A photosensor comprising:
    a $PbO \cdot Cr_2O_3$ compound thin film formed on a substrate; and
    a plurality of interdigital electrodes made of an Au thin film formed on said $PbO \cdot Cr_2O_3$ compound thin film, said plurality of interdigital electrodes having a gap therebetween, wherein Au material of said Au thin film is diffused into said $PbO \cdot Cr_2O_3$ compound thin film.

14. A photosensing device comprising:
    a Cr thin film;
    an Au thin film; and
    a $PbO \cdot Cr_2O_3$ compound thin film disposed between said Cr thin film and said Au thin film wherein Au material of said Au thin film is diffused into said $PbO \cdot Cr_2O_3$ compound thin film.

15. A photosensor comprising:
    a $Pb_2CrO_5$ thin film formed on a substrate; and
    a plurality of interdigital electrodes made of an Au thin film formed between the substrate and said $Pb_2CrO_5$ thin film, said plurality of interdigital electrodes having a gap therebetween, wherein Au material of said Au thin film is diffused into said $Pb_2CrO_5$ thin film.

16. A photosensor as claimed in claim 15, said interdigital electrodes comprising a first comb-like electrode group and a second comb-like electrode group, said first and second comb-like electrode groups being electrically separated and being supplied with a predetermined voltage.

17. A photosensing device comprising:
    a Cr thin film;
    an Au thin film; and
    a $Pb_2CrO_5$ thin film disposed between said Cr thin film and said Au thin film wherein Au material of said Au thin film is diffused into said $Pb_2CrO_5$ thin film.

18. A photosensing device comprising:
    a plurality of photosensor elements, each photosensor element including a first electrode, a second electrode and a $Pb_2CrO_5$ thin film disposed between said first and second electrodes, said plurality of photosensor elements being arranged in a matrix, said first electrode being made of a Cr thin film and said second electrode being made of an Au thin film wherein Au material of said Au thin film is diffused into said $Pb_2CrO_5$ thin film.

19. A photosensor comprising:
a semi-insulating $Pb_5CrO_8$ thin film formed on a substrate; and
a plurality of interdigital electrodes of an Au thin film formed between the substrate and said $Pb_5CrO_8$ thin film, said plurality of interdigital electrodes having a gap therebetween, wherein Au material of said Au thin film is diffused into said $Pb_5CrO_8$ thin film.

20. A photosensor as claimed in claim 19, said interdigital electrodes comprising a first comb-like electrode group and a second comb-like electrode group, said first and second comb-like electrode groups being electrically separated and being supplied with a predetermined voltage.

21. A photosensing device comprising:
a Cr thin film;
an Au thin film; and
a $Pb_5CrO_8$ thin film disposed between said Cr thin film and said Au thin film wherein Au material of said Au thin film is diffused into said $Pb_5CrO_8$ thin film.

22. A photosensing device comprising a plurality of photosensor elements, each photosensor element including a first electrode, a second electrode and a $Pb_5CrO_8$ thin film disposed between said first and second electrodes, said plurality of photosensor elements being arranged in a matrix, said first electrode being made of a Cr thin film and said second electrode being made of an Au thin film, wherein Au material of said Au thin film is diffused into said $Pb_5CrO_8$ thin film.

23. A photosensor comprising:
a $PbO \cdot Cr_2O_3$ compound thin film formed on a substrate; and
a plurality of interdigital electrodes made of an Au thin film formed between the substrate and said $PbO \cdot Cr_2O_3$ compound thin film, said plurality of interdigital electrodes having a gap therebetween, wherein Au material of said Au thin film is diffused into said $PbO \cdot Cr_2O_3$ compound thin film.

24. A photosensing device comprising:
a Cr thin film;
an Au thin film; and
A $PbO \cdot Cr_2O_3$ compound thin film disposed between said Cr thin film and said Au thin film, wherein Au material of said Au thin film is diffused into said $PbO \cdot Cr_2O_3$ compound thin film.

25. A photosensor comprising:
a $Pb_2CrO_5$ thin film formed on a substrate; and
a plurality of interdigital electrodes made of a metal thin film formed between said substrate and said $Pb_2CrO_5$ thin film, said plurality of interdigital electrodes having a gap therebetween, wherein said metal thin film is any one of Au, Ag, Cu, Pb, Cr and S and is diffused into said $Pb_2CrO_5$ thin film.

26. A photosensor as claimed in claim 25, said interdigital electrodes comprising a first comb-like electrode group and a second comb-like electrode group, said first and second comb-like electrode groups being electrically separated and being supplied with a predetermined voltage.

27. A photosensing device comprising:
a first metal thin film;
a second metal thin film; and
a $Pb_2CrO_5$ thin film disposed between said first and second metal thin films wherein said first metal thin film is any one of Au, Ag, Cu, Pb, Cr and S and said first metal thin film is diffused into said $Pb_2CrO_5$ thin film.

28. A photosensing device comprising a plurality of photosensor elements, each photosensor element including a first electrode, a second electrode and a $Pb_2CrO_5$ thin film disposed between said first and second electrodes, said plurality of photosensor elements being arranged in a matrix, said first electrode being made of any one of Au, Ag, Cu, Pb, Cr and S and diffused into said $Pb_2CrO_5$ thin film.

* * * * *